United States Patent
Kitagawa et al.

(10) Patent No.: US 12,243,751 B2
(45) Date of Patent: Mar. 4, 2025

(54) CHEMICAL SOLUTION, ETCHING METHOD, AND METHOD FOR MANUFACTURING SEMICONDUCTOR DEVICE

(71) Applicant: Kioxia Corporation, Tokyo (JP)

(72) Inventors: Hakuba Kitagawa, Yokkaichi Mie (JP); Tatsuhiko Koide, Kuwana Mie (JP); Hiroshi Fujita, Mie Mie (JP)

(73) Assignee: KIOXIA CORPORATION, Tokyo (JP)

(*) Notice: Subject to any disclaimer, the term of this patent is extended or adjusted under 35 U.S.C. 154(b) by 165 days.

(21) Appl. No.: 17/466,273

(22) Filed: Sep. 3, 2021

(65) Prior Publication Data

US 2022/0310401 A1 Sep. 29, 2022

(30) Foreign Application Priority Data

Mar. 23, 2021 (JP) ................. 2021-049124

(51) Int. Cl.
| | |
|---|---|
| H01L 21/311 | (2006.01) |
| C23F 1/26 | (2006.01) |
| H01L 21/306 | (2006.01) |
| H01L 21/321 | (2006.01) |
| H01L 21/3213 | (2006.01) |

(52) U.S. Cl.
CPC .......... *H01L 21/31111* (2013.01); *C23F 1/26* (2013.01); *H01L 21/30608* (2013.01); *H01L 21/32134* (2013.01); *H01L 21/3212* (2013.01)

(58) Field of Classification Search
CPC ......... H01L 21/31111; H01L 21/30608; H01L 21/32134; H01L 21/3212; C09K 13/06; C23F 1/30
See application file for complete search history.

(56) References Cited

U.S. PATENT DOCUMENTS

| | | | | |
|---|---|---|---|---|
| 9,530,670 | B2* | 12/2016 | Han | H10B 43/27 |
| 2004/0224866 | A1* | 11/2004 | Matsunaga | C11D 3/0073 |
| | | | | 510/175 |
| 2010/0120209 | A1 | 5/2010 | Choi et al. | |
| 2012/0319033 | A1 | 12/2012 | Okabe et al. | |
| 2016/0225866 | A1 | 8/2016 | Peri et al. | |
| 2016/0351417 | A1 | 12/2016 | Akeboshi et al. | |
| 2018/0082869 | A1 | 3/2018 | Muraki et al. | |
| 2019/0071623 | A1 | 3/2019 | Kamimura et al. | |
| 2019/0284704 | A1* | 9/2019 | Ge | H01L 21/32134 |
| 2020/0091080 | A1 | 3/2020 | Wakatsuki et al. | |
| 2021/0265372 | A1* | 8/2021 | Kanakamedala | H10B 41/27 |
| 2021/0324525 | A1* | 10/2021 | Das | C23F 1/38 |

FOREIGN PATENT DOCUMENTS

| | | |
|---|---|---|
| CN | 1526807 A | 9/2004 |
| JP | H01-089436 | 4/1989 |
| JP | 2012-049535 | 3/2012 |
| JP | 2013-237873 A | 11/2013 |

(Continued)

*Primary Examiner* — Yara B Green
*Assistant Examiner* — Fakeha Sehar
(74) *Attorney, Agent, or Firm* — Foley & Lardner LLP

(57) ABSTRACT

According to one embodiment, a chemical solution comprises a mixed acid including an inorganic acid, an oxidizing agent, a carboxylic acid, and water; and polyethyleneimine of a concentration in the chemical solution in a range of 0.05 wt % to 10 wt %.

18 Claims, 19 Drawing Sheets

(56) References Cited

FOREIGN PATENT DOCUMENTS

| | | |
|---|---|---|
| JP | 2019-165225 A | 9/2019 |
| JP | 2020-047702 A | 3/2020 |
| JP | 2022-140256 A | 9/2022 |
| KR | 20170042933 A | 4/2017 |
| KR | 20180110760 A | 10/2018 |
| TW | 201018747 A1 | 5/2010 |
| TW | 201809248 A | 3/2018 |
| WO | WO-03/036707 | 5/2003 |
| WO | WO-2011/099624 A1 | 8/2011 |

\* cited by examiner (1) LARGE TOP-BOTTOM DIFFERENCE (2) SMALL TOP-BOTTOM DIFFERENCE

FIG. 18

| LOT NUMBER | ADDITIVE CONCENTRATION (wt%) | PEI MOLECULAR WEIGHT 600 | PEI MOLECULAR WEIGHT 1800 | PEI MOLECULAR WEIGHT 10000 |
|---|---|---|---|---|
| LN1 | 0.05 | 5/5 | 5/5 | - |
| LN1 | 0.15 | 1/5 | 5/5 | - |
| LN1 | 0.3 | 0/5 | 1/5 | - |
| LN2 | 0.3 | 9/54 | 4/18 | - |
| LN2 | 0.5 | 4/54 | 4/54 | 54/54 |
| LN2 | 0.9 | - | 3/54 | - |
| LN2 | 1 | 0/54 | - | - |
| LN2 | 1.5 | - | 3/54 | - |
| LN2 | 2 | 0/54 | - | - |
| LN2 | 2.78 | - | - | 6/54 |
| LN2 | 3 | 0/54 | 9/54 | - | ated with reference to the drawings. The embodiments
CHEMICAL SOLUTION, ETCHING METHOD, AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2021-049124, filed Mar. 23, 2021, the entire contents of which are incorporated herein by reference.

FIELD

Embodiments described herein relate generally to a chemical solution, an etching method, and a method for manufacturing a semiconductor device.

BACKGROUND

NAND flash memories having three-dimensionally stacked memory cells are known.

DESCRIPTION OF THE DRAWINGS

FIG. 18 is a table showing the results of a shape evaluation for Mo etching in the Example.

DETAILED DESCRIPTION

Figure 1:
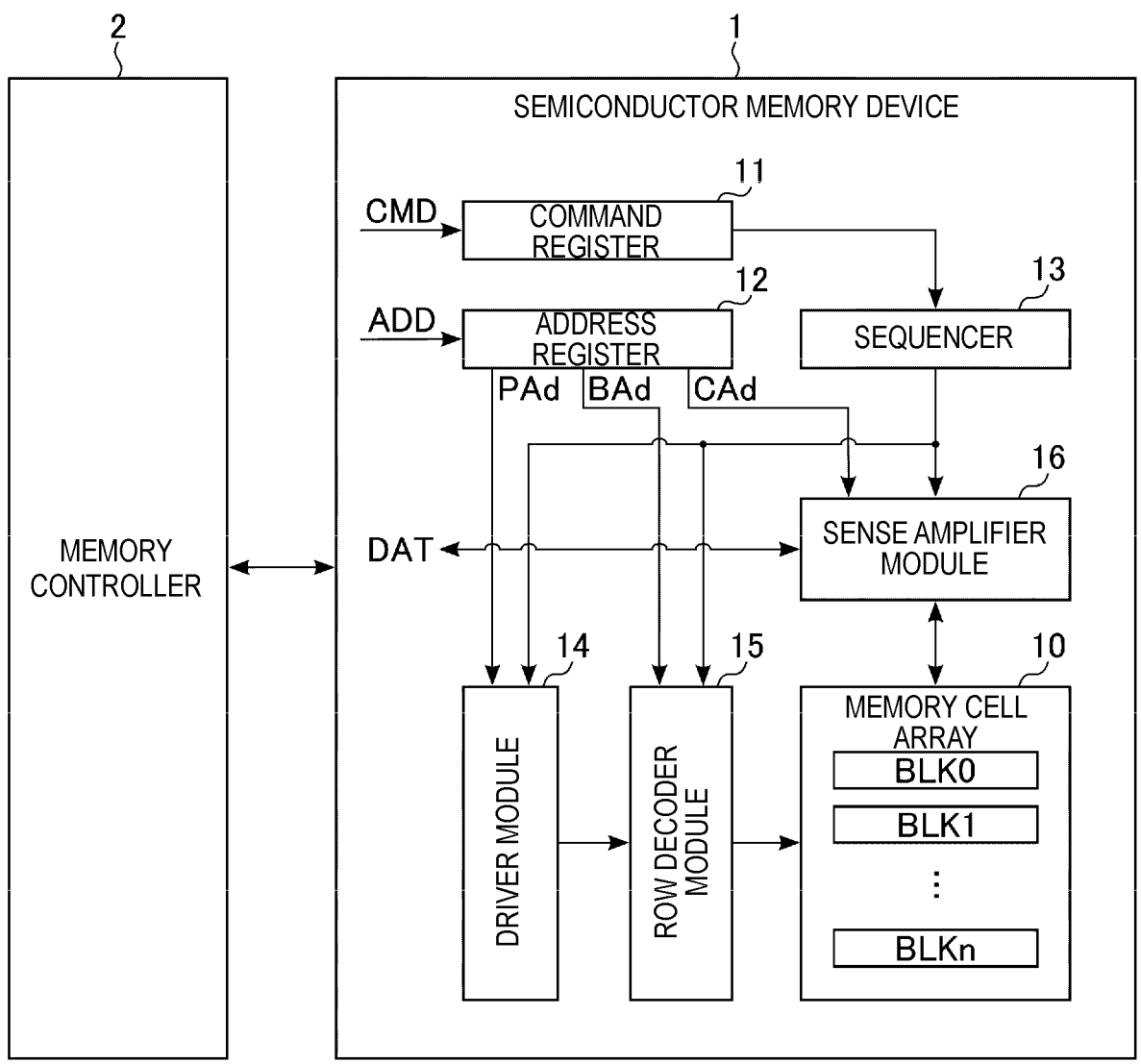
FIG. 1 is a block diagram showing an example of the overall configuration of a semiconductor device according to an embodiment.

Embodiments provide a technique for manufacturing a semiconductor device with an increased yield.

In general, according to one embodiment, a chemical solution comprises a mixed acid including an inorganic acid, an oxidizing agent, a carboxylic acid, and water; and polyethyleneimine of a concentration in the chemical solution in a range of 0.05 wt % to 10 wt %.

Embodiments of the present disclosure will now be described with reference to the drawings. The embodiments illustrate a device, a method, etc. that embody the technical concept of the present disclosure. The drawings are schematic or conceptual; thus, dimensions, size ratios, etc. illustrated in the drawings are not necessarily to scale. The technical concept of the present disclosure is not specified by the shapes, structures, arrangement, etc. of components or elements.

In the drawings and the description below, the same symbols are used for components or elements having the same function and configuration. A numeral following a letter constituting a reference symbol is used to be referred to by a reference symbol that includes the same letter and to distinguish between components or elements having the same configuration. Similarly, a letter following a numeral constituting a reference symbol is used to be referred to by a reference symbol that includes the same numeral and to distinguish between components or elements having the same configuration.

Embodiments

A chemical solution according to an embodiment is an etching solution for use in etching of a layer comprising molybdenum. The chemical solution according to the embodiment is used, for example, in etching of a layer comprising molybdenum, formed in a structure having a high aspect ratio, in a process for manufacturing a semiconductor device 1. The chemical solution according to the embodiment and the semiconductor device 1 according to an embodiment will be described in this order.

1 Composition of Chemical Solution

The chemical solution according to the embodiment comprises a mixed acid and polyethyleneimine (PEI). The mixed acid comprises an inorganic acid, an oxidizing agent, a carboxylic acid, and water. Polyethyleneimine is a polymer includes repeating unit composed of the amine group and two carbon aliphatic, and is a one of organic amine compound.

The concentration of polyethyleneimine in the chemical solution is in the range of 0.05 wt % to 10 wt %. When the concentration of polyethyleneimine is in this range, because of the anticorrosion effect of polyethyleneimine on molybdenum, it has an etching rate reducing effect. The concentration of polyethyleneimine is preferably in the range of 1 wt % to 3 wt %.

The concentration of the inorganic acid in the chemical solution is, for example, in the range of 40 wt % to 80 wt %. When the concentration of the inorganic acid is in this range, because of the complexing effect of the inorganic acid, the chemical solution exerts an etching effect. The inorganic acid may be at least one selected from the group consisting of phosphoric acid and sulfuric acid.

The concentration of the oxidizing agent in the chemical solution is, for example, not more than 5 wt %. When the concentration of the oxidizing agent is in this range, because of the oxidizing effect of the oxidizing agent, the chemical solution enables complexing with the inorganic acid. The oxidizing agent may be at least one selected from the group consisting of nitric acid and hydrogen peroxide.

The concentration of the carboxylic acid in the chemical solution is, for example, in the range of 0.1 wt % to 45 wt %. When the concentration of the carboxylic acid is in this range, because of the buffering effect of the carboxylic acid, the chemical solution exerts a composition stabilizing effect. The carboxylic acid may be at least one selected from the group consisting of acetic acid, lactic acid, propionic acid, butyric acid, malonic acid, and citric acid.

The concentration of water in the chemical solution is, for example, in the range of 5 wt % to 30 wt %, and preferably not more than 20 wt %.

The average molecular weight of PEI in the chemical solution may be not less than 100 and not more than 1800. The weight-average molecular weight of PEI is hereinafter also referred to as the "molecular weight of PEI". It is preferred that the concentration of polyethyleneimine in the chemical solution be in the range of 0.15 wt % to 0.5 wt %, and the molecular weight of PEI be not less than 100 and not more than 600, or that the concentration of polyethyleneimine in the chemical solution be in the range of 0.3 wt % to 0.5 wt %, and the molecular weight of PEI be not less than 100 and not more than 1800. It is more preferred that the concentration of polyethyleneimine in the chemical solution be in the range of 0.3 wt % to 0.5 wt %, and the molecular weight of PEI be not less than 100 and not more than 600.

The polyethyleneimine contained in the chemical solution according to the embodiment comprises, for example, ethyleneimine repeating units as monomer units. The polyethyleneimine may be a polymer consisting solely of such monomer units, or a copolymer comprising another monomer, or a mixture thereof. The proportion of ethyleneimine repeating units in all the monomer units of polyethyleneimine is preferably not less than 95 mol %, more preferably 100 mol %. Thus, the polyethyleneimine, contained as an additive in the chemical solution, is most preferably a polymer consisting solely of ethyleneimine repeating units as monomer units.

The presence or absence of polyethyleneimine in the chemical solution may be determined by analysis using FT-IR (Fourier Transform Infrared Spectroscopy) and NMR (Nuclear Magnetic Resonance). The weight-average molecular weight of polyethyleneimine in the chemical solution may be determined by GPC (Gel Permeation Chromatography).

2 Configuration of Semiconductor Device 1

[2-1] Overall configuration of Semiconductor Device 1

FIG. 1 is a block diagram showing an example of the overall configuration of the semiconductor device 1 according to an embodiment. The semiconductor device 1 is a NAND flash memory capable of non-volatilely storing data, and is controlled by an external memory controller 2. As shown in FIG. 1, the semiconductor device 1 includes, for example, a memory cell array 10, a command register 11, an address register 12, a sequencer 13, a driver module 14, a row decoder module 15, and a sense amplifier module 16.

The memory cell array 10 includes blocks BLK0 to BLKn (n is an integer equal to or greater than 1). The blocks BLK are an assembly of memory cells capable of non-volatilely storing data, and are used, for example, as a data erasing unit. The memory cell array 10 is provided with bit lines and word lines. Each memory cell is, for example, related to one bit line and one word line. The detailed configuration of the memory cell array 10 will be described below.

The command register 11 stores commands CMD which the semiconductor device 1 has received from the memory controller 2. The commands CMD include, for example, a command to cause the sequencer 13 to execute a read operation, a write operation, an erasing operation, etc.

The address register 12 stores address information ADD which the semiconductor device 1 has received from the memory controller 2. The address information ADD includes, for example, a block address BAd, a page address PAd, and a column address CAd. The block address BAd, the page address PAd and the column address CAd are used for selection of a block BLK, a word line and a bit line, respectively.

The sequencer 13 controls the overall operation of the semiconductor device 1. For example, the sequencer 13 controls the driver module 14, the row decoder module 15, the sense amplifier module 16, etc. based on the commands CMD, stored in the command register 11, to execute a read operation, a write operation, an erasing operation, etc.

The driver module 14 generates a voltage for use in a read operation, a write operation, an erasing operation, etc. The driver module 14 applies the voltage generated to a signal line corresponding to a selected word line based on, for example, the page address PAd stored in the address register 12.

The row decoder module 15, based on the block address BAd stored in the address register 12, selects a corresponding block BLK in the memory cell array 10. The row decoder module 15 transfers, for example, the voltage, applied to the signal line corresponding to the selected word line, to a selected word line in the selected block BLK.

The sense amplifier module 16, in a write operation, applies a desired voltage to each bit line based on write data DAT received from the memory controller 2. Further, the sense amplifier module 16, in a read operation, makes a determination on data stored in a memory cell based on a bit-line voltage, and transfers the determination results as read data DAT to the memory controller 2.

The semiconductor device 1 and the memory controller 2 may be combined into a single semiconductor device. Such a semiconductor device is exemplified by a memory card such as an SD™ card, and an SSD (solid state drive).

2-2 Circuit configuration of Memory Cell Array 10

Figure 2:
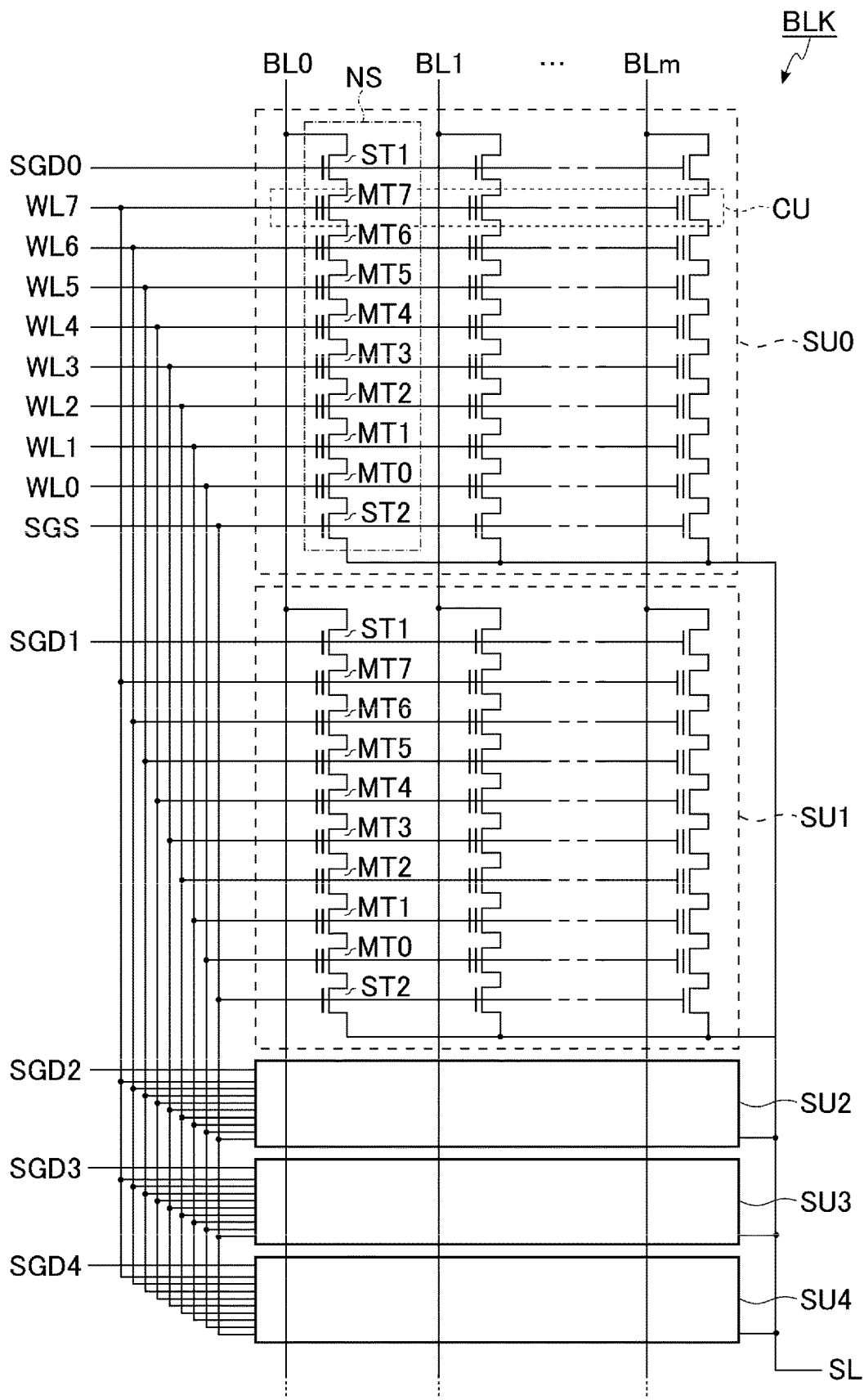
FIG. 2 is a circuit diagram showing an example circuit configuration of a memory cell array provided in the semiconductor device according to the embodiment.

FIG. 2 is a circuit diagram showing an example circuit configuration of the memory cell array 10 provided in the semiconductor device 1 according to the embodiment. FIG. 2 shows one of the blocks BLK of the memory cell array 10. As shown in FIG. 2, the block BLK includes, for example, five string units SU0 to SU4.

Each string unit SU includes a plurality of NAND strings NS respectively related to bit lines BL0 to BLm (m is an integer equal to or greater than 1). Each NAND string NS includes, for example, memory cell transistors MT0 to MT7, and select transistors ST1 and ST2. Each memory cell transistor MT includes a control gate and a charge storage layer, and non-volatilely stores data. Each of the select transistors ST1 and ST2 is used for selection of a string unit SU upon an operation.

In each NAND string NS, the memory cell transistors MT0 to MT7 are connected in series. The drain of the select transistor ST1 is connected to a related bit line BL. The source of the select transistor ST1 is connected to one end of the series-connected memory cell transistors MT0 to MT7. The drain of the select transistor ST2 is connected to the other end of the series-connected memory cell transistors MT0 to MT7. The source of the select transistor ST2 is connected to a source line SL.

In the same block BLK, the control gates of the memory cell transistors MT0 to MT7 are respectively connected to word lines WL0 to WL7. The gates of the select transistors ST1 in the string unit SU0 are connected to a select gate line SGD0. The gates of the select transistors ST1 in the string unit SU1 are connected to a select gate line SGD1. The gates of the select transistors ST1 in the string unit SU2 are connected to a select gate line SGD2. The gates of the select transistors ST1 in the string unit SU3 are connected to a select gate line SGD3. The gates of the select transistors ST1 in the string unit SU4 are connected to a select gate line SGD4. The gates of the select transistors ST2 are connected to a select gate line SGS.

Different column addresses are assigned to the bit lines BL0 to BLm. Each bit line BL is shared by those NAND strings of a plurality of blocks BLK to which the same column address has been assigned. The word lines WL0 to WL7 are provided in each block BLK. The source line SL is, for example, shared by a plurality of blocks BLK.

The group of memory cell transistors MT, which are connected to a common word line WL in one string unit SU, is called e.g. a cell unit CU. For example, the storage capacity of a cell unit CU, including memory cell transistors MT which each store 1-bit data, is defined as "1-page data". A cell unit CU may have a storage capacity of not less than 2-page data depending on the bit number of data the memory cell transistors MT store.

The memory cell array 10 provided in the semiconductor device 1 according to the embodiment may have a different circuit configuration. For example, the number of the string units SU in each block BLK, and the number of the memory cell transistors MT and the select transistors ST1 and ST2 in each NAND string may be selected freely.

2-3 Structure of Memory Cell Array 10

An example configuration of the memory cell array 10 provided in the semiconductor device 1 according to the embodiment will now be described. In the drawings referred to below, X direction corresponds to the direction in which the word lines WL extend, Y direction corresponds to the direction in which the bit lines BL extend, and Z direction corresponds to a direction perpendicular to the surface of a semiconductor substrate 20 for use in the formation of the semiconductor device 1. Hatching in a plan view is made for the purpose of easier understanding, and is not related to the material and property of a hatched component or element. A component or element has been omitted in a cross-sectional view for the purpose of easier understanding. Further, a simplified configuration may be shown in the drawings.

(Planar Layout of Memory Cell Array 10)

Figure 3:
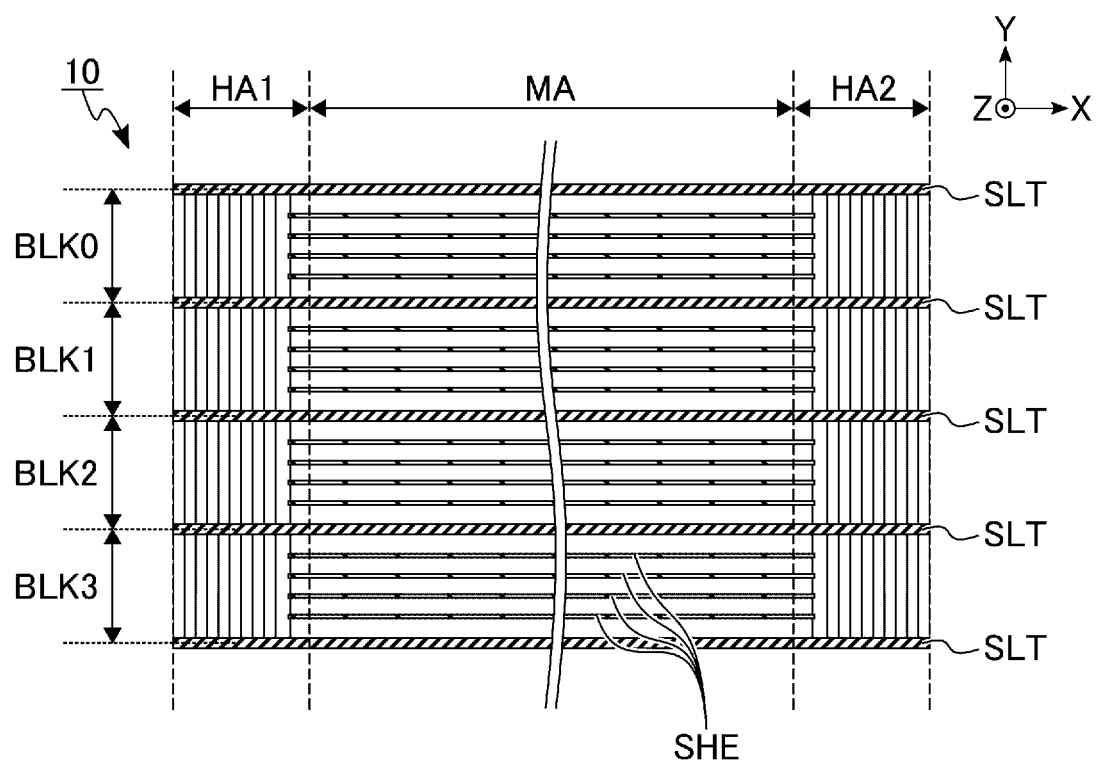
FIG. 3 is a plan view showing an example planar layout of the memory cell array provided in the semiconductor device according to the embodiment.

FIG. 3 is a plan view showing an example planar layout of the memory cell array 10 provided in the semiconductor device according to the embodiment. FIG. 3 shows areas corresponding to four blocks BLK0 to BLK3 in the memory cell array 10. As shown in FIG. 3, the memory cell array 10, in a plan view, is divided e.g. into a memory area MA and extraction areas HA1 and HA2 in the X direction. The memory cell array 10 includes, for example, a plurality of slits SLT and a plurality of slits SHE.

The memory area MA includes a plurality of NAND strings NS. The memory area MA is sandwiched by the extraction areas HA1 and HA2 in the X direction. Each of the extraction areas HA1 and HA2 is used for connection between stacked interconnects (word lines WL and select gate lines SGD and SGS) and the row decoder module 15. For example, each of the extraction areas HA1 and HA2 includes a portion (terrace portion) which does not overlap an upper interconnect layer (conductor layer) of each of the select gate lines SGS, the word lines WL0 to WL7, and the select gate lines SGD. In each block BLK, contacts are provided respectively on a terrace portion of each of the select gate lines SGS, the word lines WL0 to WL7, and the select gate lines SGD0 to SGD4. The contacts for the stacked interconnects are provided, for example, in the extraction area HA1 in the even-numbered blocks BLK, and in the extraction area HA2 in the odd-numbered blocks BLK.

The slits SLT each have a portion extending in the X direction, and are arranged in the Y direction. Each slit SLT traverses the memory area MA and the extraction areas HA1 and HA2 in the X direction. Each slit SLT has, for example, a structure in which an insulator and a plate-like contact are embedded in the slit. Each slit SLT separates interconnects (e.g., the word lines WL0 to WL7 and the select gate lines SGD and SGS) located adjacent to each other via the slit SLT. The aspect ratio of each slit SLT is, for example, not less than 30.

The slits SHE each have a portion extending in the X direction, and are arranged in the Y direction. In the illustrated embodiment, four slits SHE are disposed between every adjacent slits SLT. Each slit SHE traverses the memory area MA in the X direction. One end of each slit SHE lies in the extraction area HA1, while the other end lies in the extraction area HA2. Each slit SHE has, for example, a structure in which an insulator is embedded in the slit. Each slit SHE separates interconnects (at least the select gate lines SGD) located adjacent to each other via the slit SHE.

In the above-described planar layout of the memory cell array 10, each of the areas separated by the slits SLT corresponds to one block BLK. Each of the areas separated by the slits SLT and SHE corresponds to one string unit SU. The memory cell array 10 has, for example, a repetition of the layout shown in FIG. 3, arranged in the Y direction.

The memory cell array 10 provided in the semiconductor device 1 according to the embodiment may have a different planar layout. For example, the number of the slits SHE disposed between adjacent slits SLT may be selected freely. The number of the string units SU formed between adjacent slits SLT may be changed based on the number of the slits SHE disposed between adjacent slits SLT.

(Planar Layout in Memory Area MA of Memory Cell Array 10)

Figure 4:
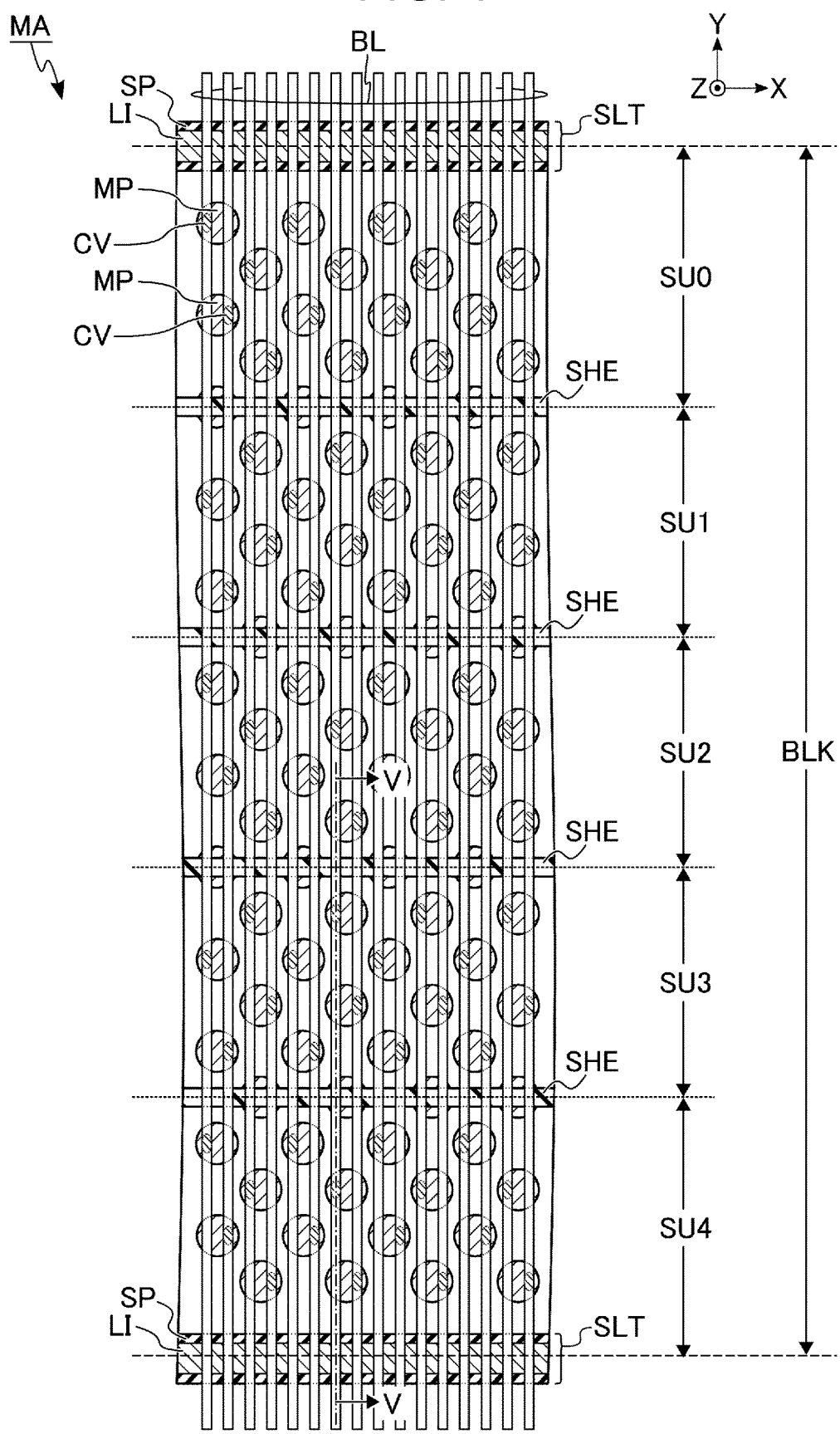
FIG. 4 is a plan view showing an example of a detailed planar layout in a memory area of the memory cell array provided in the semiconductor device according to the embodiment.

FIG. 4 is a plan view showing an example of a detailed planar layout in the memory area MA of the memory cell array 10 provided in the semiconductor device according to the embodiment. FIG. 4 shows an area including one block BLK (i.e. string units SU0 to SU4). As shown in FIG. 4, the memory cell array 10 includes, in the memory area MA, memory pillars MP, contacts CV, and bit lines BL. Each slit SLT includes a contact LI and spacers SP.

Each of the memory pillars MP functions, for example, as a NAND string NS. In an area between two adjacent slits SLT, the memory pillars MP are arranged, for example, in a 24-row zigzag pattern. For example, the 5th-row memory pillars MP, the 10th-row memory pillars MP, the 15th-row memory pillars MP, and the 20th-row memory pillars MP, as counted from the top row in FIG. 4, respectively overlap one slit SHE.

The bit lines BL each have a portion extending in the Y direction, and are arranged in the X direction. The bit lines BL are disposed such that each bit line BL overlaps at least one memory pillar MP in every string unit SU. Further, in the illustrated embodiment, the bit lines BL are disposed such that one memory pillar MP overlaps two bit lines BL. A memory pillar MP is electrically connected via a contact CV to one of the bit lines BL that overlap the memory pillar MP.

A contact CV is omitted, for example, between a memory pillar MP in contact with a slit SHE and a bit line BL. In other words, a contact CV is omitted between a memory pillar MP in contact with two different select gate lines SGD and a bit line BL. The number and arrangement of the memory pillars MP, the slits SHE, etc. between adjacent slits SLT may be changed. For example, the number of bit lines BL that overlap each memory pillar MP may be selected freely.

The contact LI is a conductor having a portion extending in the X direction. The spacers SP are insulators provided on both sides of the contact LI. The contact LI is sandwiched by the spacers SP. The contact LI is isolated and insulated by the spacers SP from conductors (e.g., the word lines WL0 to WL7 and the select gate lines SGD and SGS) lying adjacent to the contact LI in the Y direction.

(Cross-Sectional Structure in Memory Area MA of Memory Cell Array 10)

Figure 5:
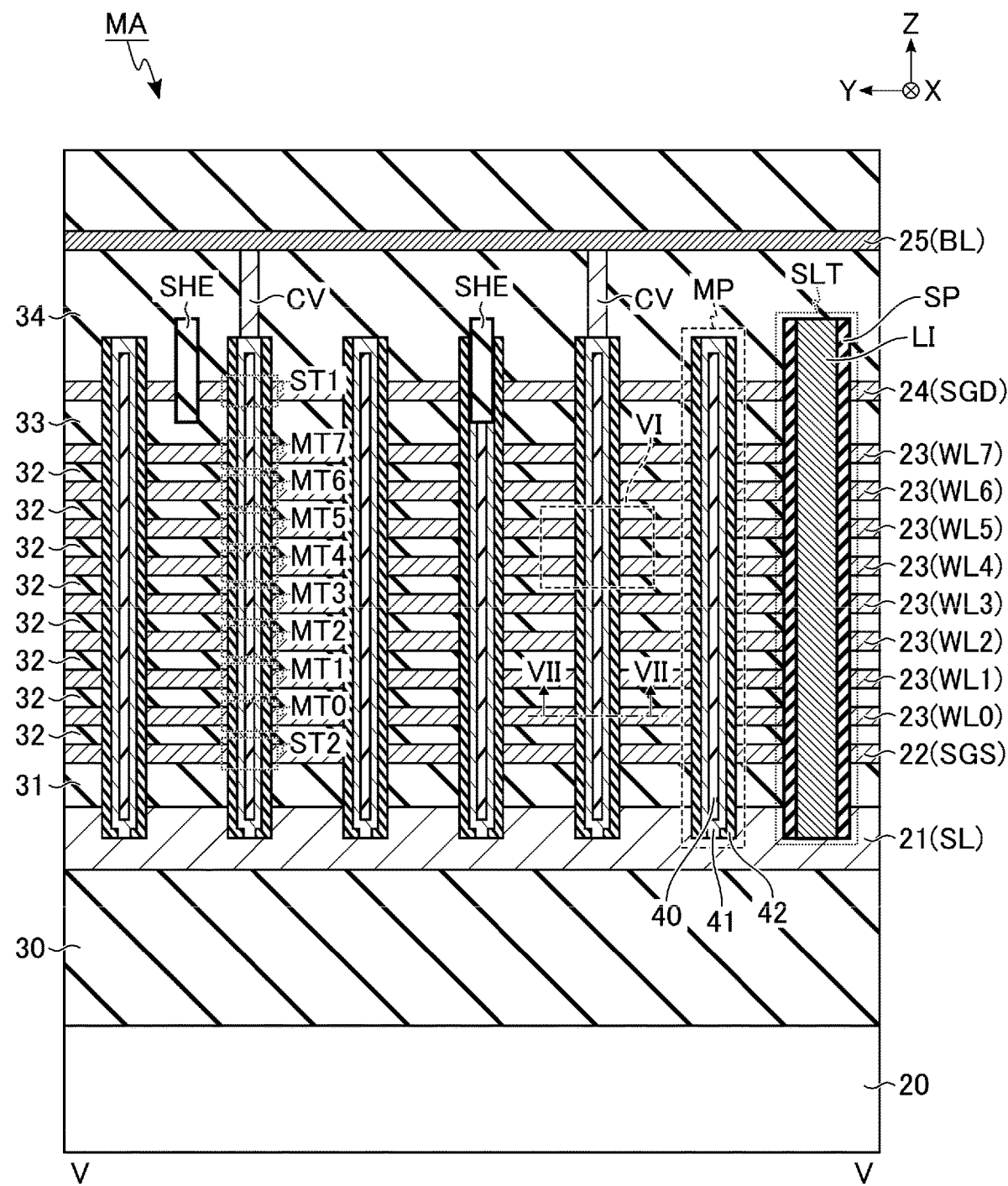
FIG. 5 is a cross-sectional view on the line V-V of FIG. 4, showing an example cross-sectional structure in a memory area of the memory cell array provided in the semiconductor device according to the embodiment.

FIG. 5 is a cross-sectional view on the line V-V of FIG. 4, showing an example cross-sectional structure in the memory area MA of the memory cell array 10 provided in the semiconductor device 1 according to the embodiment. As shown in FIG. 5, the memory cell array 10 further includes, for example, a semiconductor substrate 20, conductor layers 21 to 25, and insulator layers 30 to 34.

In particular, an insulator layer 30 is provided on the semiconductor substrate 20. Though not shown diagrammatically, the insulator layer 30 includes a circuit corresponding to, for example, the row decoder module 15 or the sense amplifier module 16.

A conductor layer 21 is provided on the insulator layer 30. The conductor layer 21 has, for example, a plate-like shape extending in the XY plane, and is used as a source line SL. The conductor layer 21 comprises, for example, silicon doped with phosphorus.

An insulator layer 31 is provided on the conductor layer 21. A conductor layer 22 is provided on the insulator layer 31. The conductor layer 22 has, for example, a plate-like shape extending in the XY plane, and is used as a select gate line SGS. The conductor layer 22 comprises, for example, molybdenum. The conductor layer 22 comprises, for example, elemental molybdenum in an amount of not less than 99 atom %.

Insulator layers 32 and conductor layers 23 are stacked alternately on the conductor layer 22. Each conductor layer 23 has, for example, a plate-like shape extending in the XY plane. The stacked conductor layers 23 are used as the word lines WL0 to WL7 respectively in order of distance from the semiconductor substrate 20. The conductor layers 23 comprise molybdenum. The conductor layers 23 comprise, for example, elemental molybdenum in an amount of not less than 99 atom %.

An insulator layer 33 is provided on the topmost conductor layer 23. A conductor layer 24 is provided on the insulator layer 33. The conductor layer 24 has, for example, a plate-like shape extending in the XY plane, and is used as a select gate line SGD. The conductor layer 24 comprises, for example, molybdenum. The conductor layer 24 comprises, for example, elemental molybdenum in an amount of not less than 99 atom %.

An insulator layer 34 is provided on the conductor layer 24. A conductor layer 25 is provided on the insulator layer 34. The conductor layer 25 has, for example, a line shape extending in the Y direction, and is used as a bit line BL. Thus, in a not-shown area, a plurality of conductor layers 25 are arranged in the X direction. The conductor layers 25 comprise, for example, copper.

Each of the memory pillars MP extends in the Z direction, and penetrates the insulator layers 31 to 33 and the conductor layers 22 to 24. The bottom of each memory pillar MP is in contact with the conductor layer 21. An area of intersection between each memory pillar MP and the conductor layer 22 functions as a select transistor ST2. An area of intersection between each memory pillar MP and the conductor layer 23 functions as a memory cell transistor MT. An area of intersection between each memory pillar MP and the conductor layer 24 functions as a select transistor ST1.

Each of the memory pillars MP includes, for example, a core member 40, a semiconductor layer 41, and a stacked film 42. The core member 40 extends in the Z direction. For example, the upper end of the core member 40 lies above the conductor layer 24, while the lower end of the core member 40 reaches the conductor layer 21. The semiconductor layer 41 covers the circumference of the core member 40. A part of the semiconductor layer 41, located at the bottom of each memory pillar MP, is in contact with the conductor layer 21. The stacked film 42 covers the side surface and the bottom surface of the semiconductor layer 41 except that part of the semiconductor layer 41 which is in contact with the conductor layer 21. The core member 40 is composed of, for example, an insulating material such as silicon oxide. The semiconductor layer 41 comprises, for example, silicon.

A columnar contact CV is provided on the semiconductor layer 41 in a memory pillar MP. In the illustrated area, two contacts CV are shown in two of the 6 memory pillars MP. In the memory area MA, the memory pillars MP which do not overlap a slit SHE and to which no contact area CV is shown to be connected, are each provided with a contact CV connected to the memory pillar MP in a not-shown area.

One conductor layer 25, namely one bit line BL, is in contact with a contact CV. One contact CV is in contact with one conductor layer 25 in each of the spaces separated by the slits SLT and SHE. Thus, memory pillars MP provided between every adjacent slits SLT and SHE, and memory pillars MP provided between every two adjacent slits SHE are electrically connected to each of the conductor layers 25.

Each slit SLT has, for example, a portion extending in the XZ plane, and separates the conductor layers 22 to 24. The contact LI in the slit SLT is provided along the slit SLT. A part of the upper end of the contact LI is in contact with the insulator layer 34. The lower end of the contact LI is in contact with the conductor layer 21. The contact LI is used, for example, as a part of a source line SL. The spacers SP are provided at least between the contact LI and the conductor layers 22 to 24. The contact LI is isolated and insulated from the conductor layers 22 to 24 by the spacers SP.

Each slit SHE has, for example, a portion extending in the XZ plane, and separates at least the conductor layer 24. The upper end of the slit SHE is in contact with the insulator layer 34. The lower end of the slit SHE is in contact with the insulator layer 33. The slit SHE comprises, for example, an insulating material such as silicon oxide. The top of the slit SHE may or may not be flush with the top of the slit SLT. The top of the slit SHE may or may not be flush with the top of the memory pillar MP.

(Detailed Cross-Sectional Structure in Memory Area MA of Memory Cell Array 10)

Figure 6:
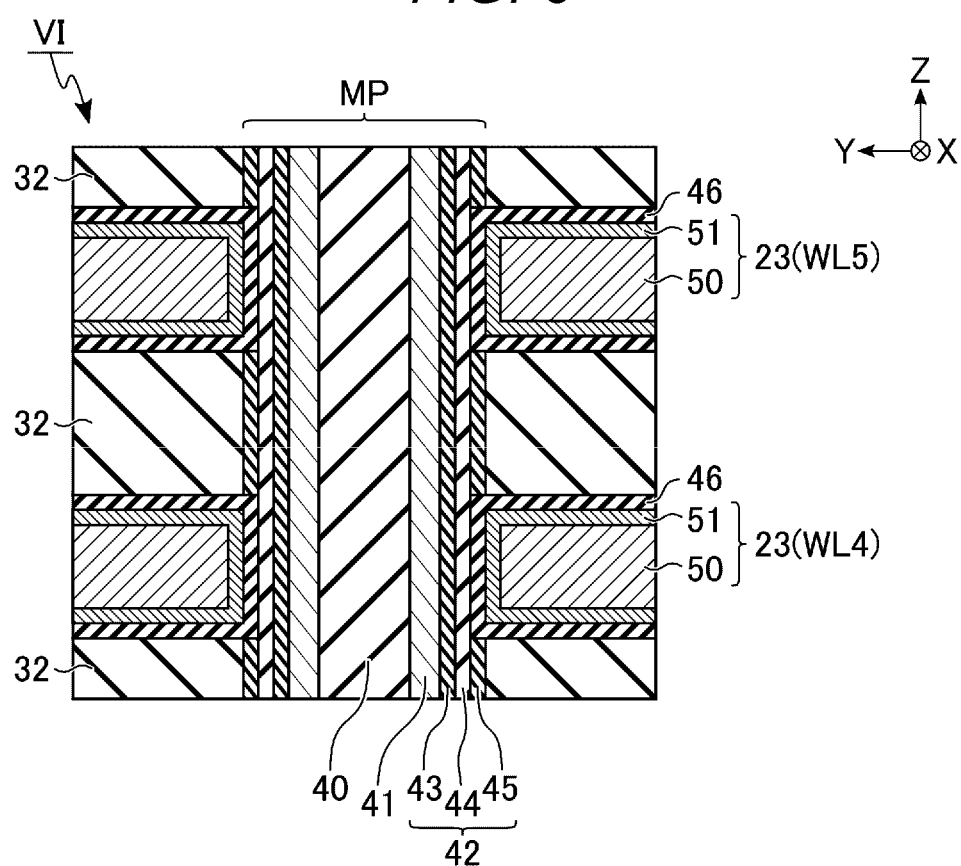
FIG. 6 is an enlarged view of the area VI of FIG. 5, showing an example of a detailed cross-sectional structure in a memory area of the memory cell array provided in the semiconductor device according to the embodiment.

FIG. 6 is an enlarged view of the area VI of FIG. 5, showing an example of a detailed cross-sectional structure in the memory area MA of the memory cell array 10 provided in the semiconductor device 1 according to the embodiment. In particular, FIG. 6 shows the structure of the memory pillar MP and the structure of the conductor layer 23 in an area of intersection between the conductor layer 23 and the memory pillar MP. As shown in FIG. 6, the stacked film 42 includes, for example, a tunnel insulating film 43, an insulating film 44, and a cover insulating film 45. The conductor layer 23 includes, for example, a conductor 50 and a barrier metal 51. The memory cell array 10 further includes a block insulating film 46.

The tunnel insulating film 43 is provided on the side surface of the semiconductor layer 41. The insulating film 44 is provided on the side surface of the tunnel insulating film 43. The cover insulating film 45 is provided on the side surface of the insulating film 44. The cover insulating film 45 is separated by the block insulating film 46 at the intersection of the memory pillar MP and the conductor layer 23. The block insulating film 46 is provided between the conductor layer 23 and the insulator layer 32 and between the conductor layer 23 and the insulating film 44. The conductor 50 is embedded in a space whose three sides are surrounded by the block insulating film 46. The conductor 50 is isolated from the block insulating film 46 by the barrier metal 51.

An insulating material such as silicon oxide, silicon nitride, or silicon oxynitride is used for the tunnel insulating film 43. The cover insulating film 45 comprises, for example, silicon oxide. The insulating film 44 comprises, for example, silicon nitride. The block insulating film 46 comprises, for example, aluminum oxide ($Al_2O_3$). The block insulating film 46 is also used as a seed layer for forming the conductor 50. The conductor 50 comprises molybdenum (Mo). The conductor 50 may contain impurities. Impurities that may be contained in the conductor 50 include oxygen (O), hydrogen (H), etc. The barrier metal 51 comprises, for example, titanium nitride (TiN).

The barrier metal 51 may be omitted. The block insulating film 46 may be provided in the side of the memory pillar MP instead of the cover insulating film 45. The structures of the conductor layer 22 and the memory pillar MP in an area of intersection between the conductor layer 22 and the memory pillar MP, and the structures of the conductor layer 24 and the memory pillar MP in an area of intersection between the conductor layer 24 and the memory pillar MP, are each the same as the structures of the conductor layer 23 and the memory pillar MP in an area of intersection between the conductor layer 23 and the memory pillar MP.

(Cross-Sectional Structure of Memory Pillar MP)

Figure 7:
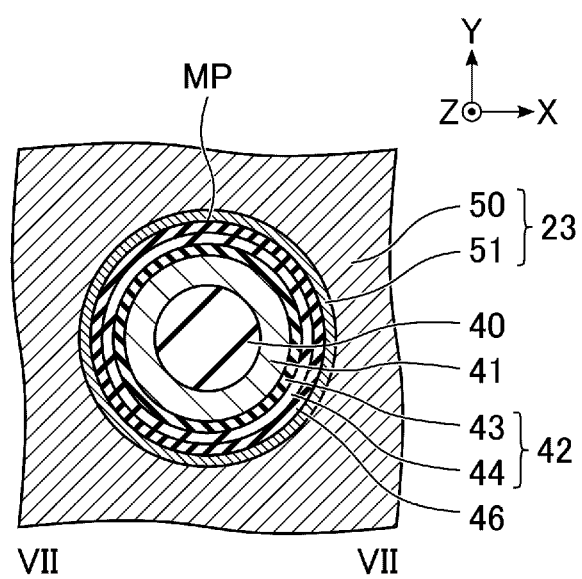
FIG. 7 is a cross-sectional view on the line VII-VII of FIG. 5, showing an example cross-sectional structure of a memory pillar in the semiconductor device according to the embodiment.

FIG. 7 is a cross-sectional view on the line VII-VII of FIG. 5, showing an example cross-sectional structure of the memory pillar MP in the semiconductor device 1 according to the embodiment. In particular, FIG. 7 shows the cross-sectional structure of the memory pillar MP in a cross-section parallel to the surface of the semiconductor substrate 20 and containing the conductor layer 23. As shown in FIG. 7, in the cross-section containing the conductor layer 23, the core member 40 is located in the center of the memory pillar MP. The semiconductor layer 41 surrounds the side surface of the core member 40. The tunnel insulating film 43 surrounds the side surface of the semiconductor layer 41. The insulating film 44 surrounds the side surface of the tunnel insulating film 43. The block insulating film 46 surrounds the side surface of the insulating film 44. The barrier metal 51 surrounds the side surface of the block insulating film 46. The conductor layer 23 surrounds the side surface of the barrier metal 51.

The structures of the conductor layer 22 and the memory pillar MP in a cross-section parallel to the surface of the semiconductor substrate 20 and containing the conductor layer 22, and the structures of the conductor layer 24 and the memory pillar MP in a cross-section parallel to the surface of the semiconductor substrate 20 and containing the conductor layer 24, are each the same as the structures of the conductor layer 23 and the memory pillar MP in a cross-section parallel to the surface of the semiconductor substrate 20 and containing the conductor layer 23. In the memory pillar MP described above, the semiconductor layer 41 is used as a channel (current pathway) for the memory cell transistors MT0 to MT7 and the select transistors ST1 and ST2. The insulating film 44 is used as a charge storage layer of a memory cell transistor MT. The semiconductor device 1, by turning the memory cell transistors MT0 to MT7 and the select transistors ST1 and ST2 on, passes electric current between a bit line BL and a contact LI via a memory pillar MP.

3 Method for Manufacturing Semiconductor Device 1

Figure 8:
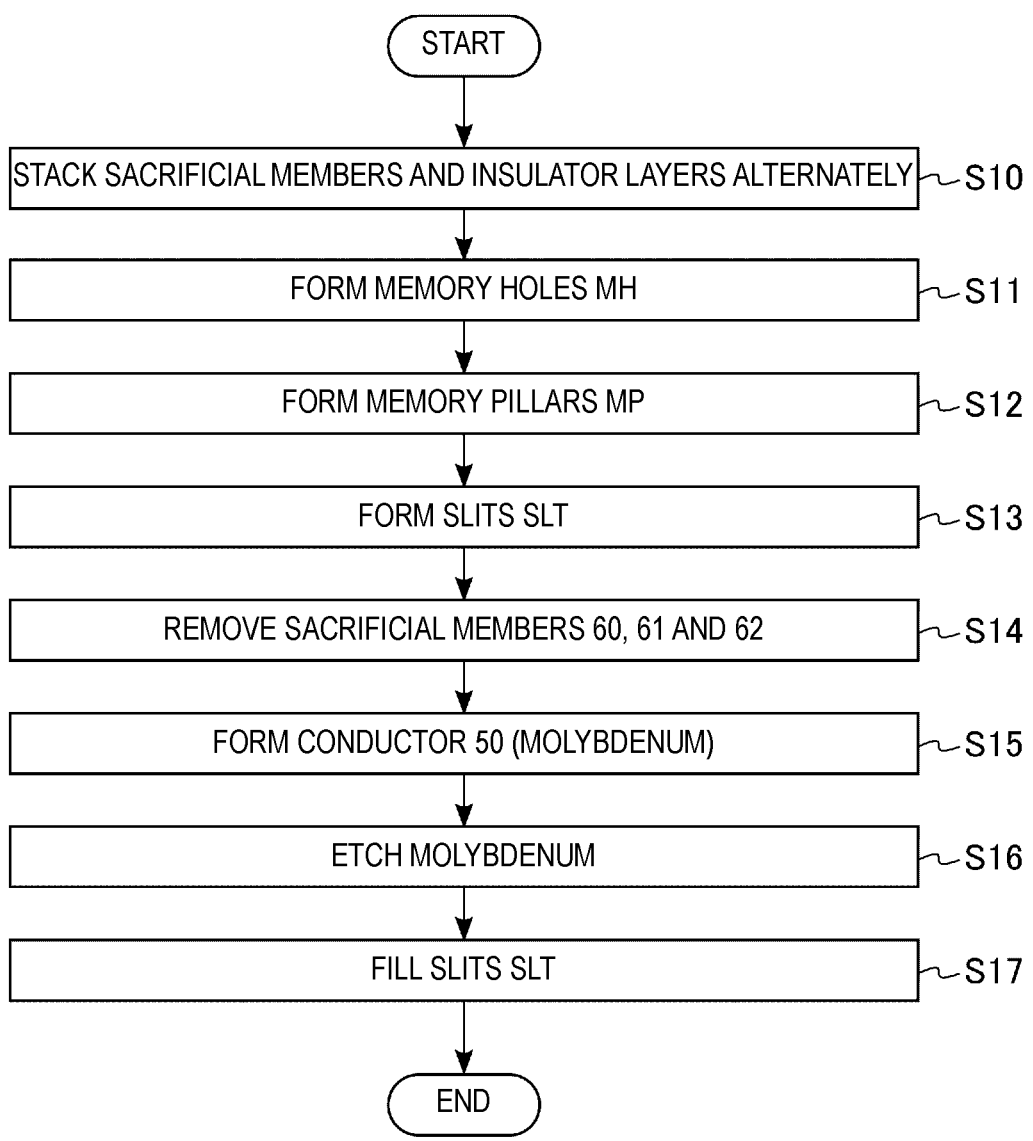
FIG. 8 is a flow chart showing a semiconductor device manufacturing method according to an embodiment.

FIG. 8 is a flow chart showing a semiconductor device 1 manufacturing method according to an embodiment.

FIGS. 9 through 16 are each a cross-sectional view showing an example cross-sectional structure of the semiconductor device 1 according to the embodiment in the course of its manufacture, and showing the same area as FIG. 5. An example manufacturing process for the formation of the stacked interconnects of the memory cell array 10 in the semiconductor device 1 according to the embodiment will now be described with reference also to FIG. 8. As shown in FIG. 8, the semiconductor device 1 manufacturing method sequentially performs, for example, the following steps S10 to S17.

Figure 9:
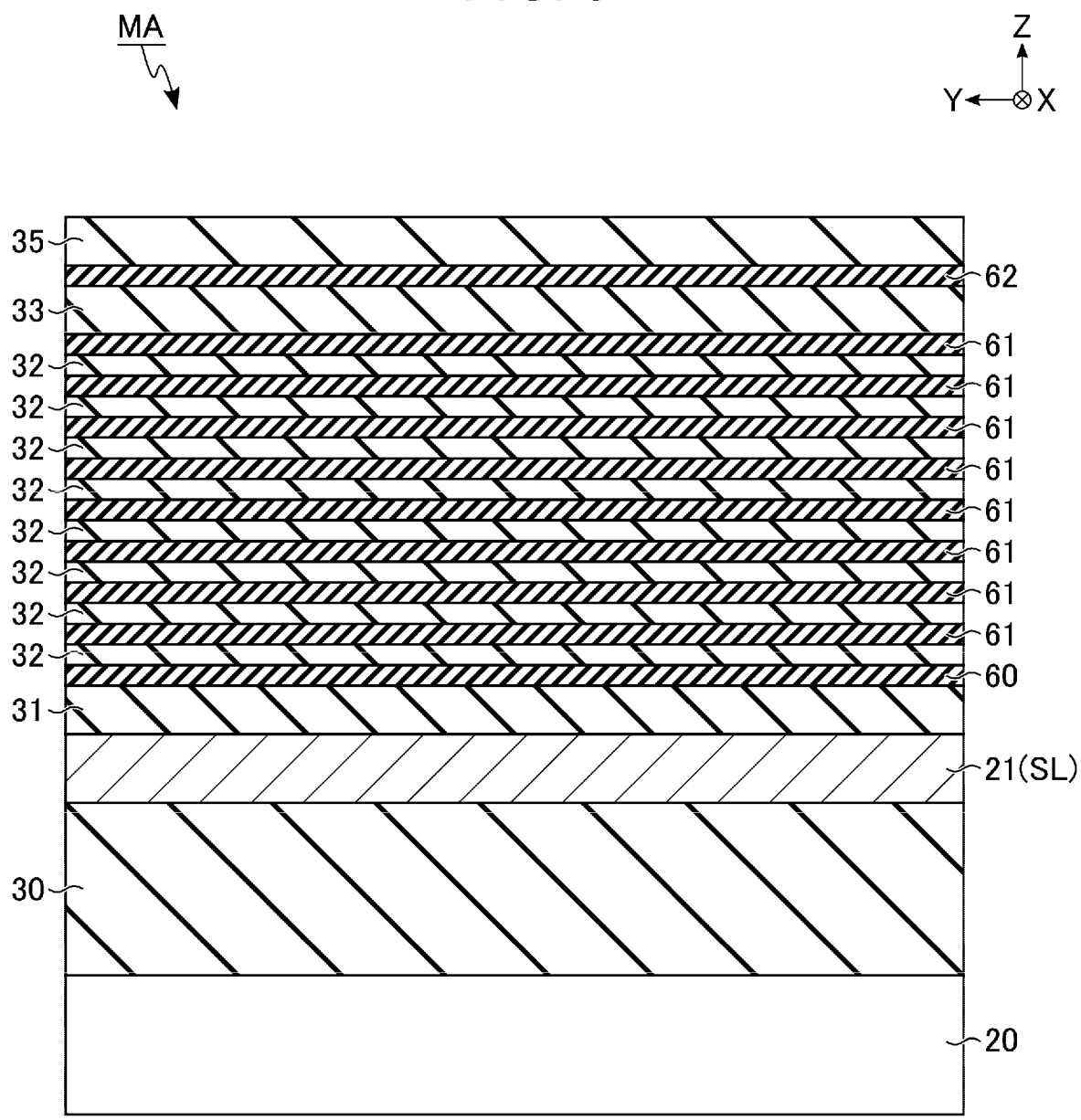
FIG. 9 is a cross-sectional view showing an example cross-sectional structure of the semiconductor device according to the embodiment in the course of its manufacture.

In step S10, sacrificial members and insulator layers are stacked alternately as shown in FIG. 9. Put simply, an insulator layer 30 including a circuit (not shown) corresponding to a row decoder module 15, etc. is formed on a semiconductor substrate 20. A conductor layer 21 is formed on the insulator layer 30. An insulator layer 31 and a sacrificial member 60 are formed sequentially on the conductor layer 21. Insulator layers 32 and sacrificial members 61 are formed alternately on the sacrificial member 60. An insulator layer 33 and a sacrificial member 62 are formed sequentially on the topmost sacrificial member 61. An insulator layer 35 is formed on the sacrificial member 62. The sacrificial member 60 is related to a select gate line SGS. The sacrificial members 61 are related to word lines WL. The sacrificial member 62 is related to a select gate line SGD. Each of the sacrificial members 60, 61 and 62 is made of, for example, silicon nitride.

Figure 10:
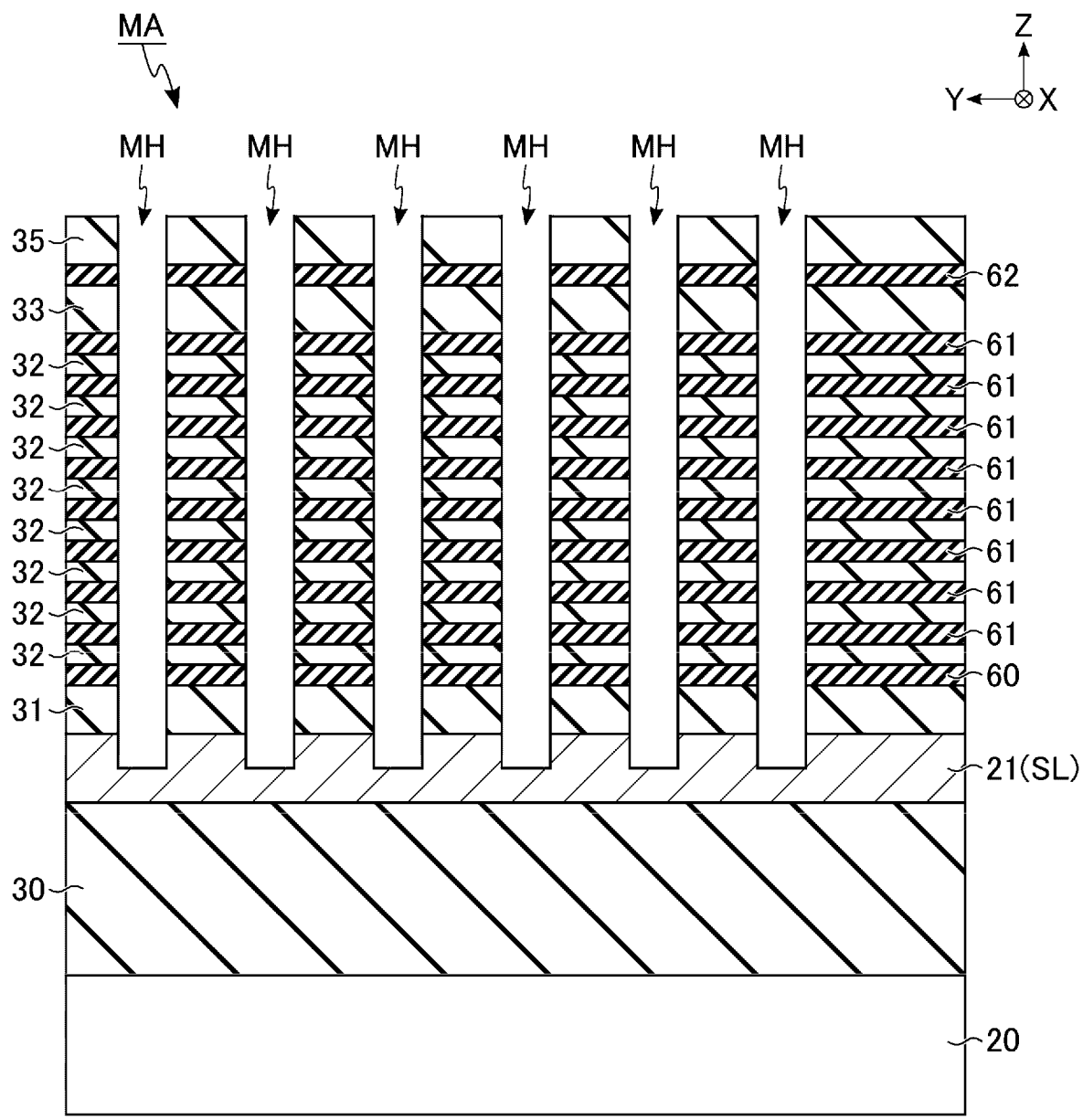
FIG. 10 is a cross-sectional view showing an example cross-sectional structure of the semiconductor device according to the embodiment in the course of its manufacture.

In step S11, memory holes MH are formed as shown in FIG. 10. In particular, a mask having openings in areas corresponding to memory pillars MP is formed. Anisotropic etching using the mask is performed to form the memory holes MH. Each memory hole MH penetrates the insulator layers 31, 32, 33 and 35, and the sacrificial members 60, 61 and 62. The bottom of each memory hole MH reaches the conductor layer 21.

Figure 11:
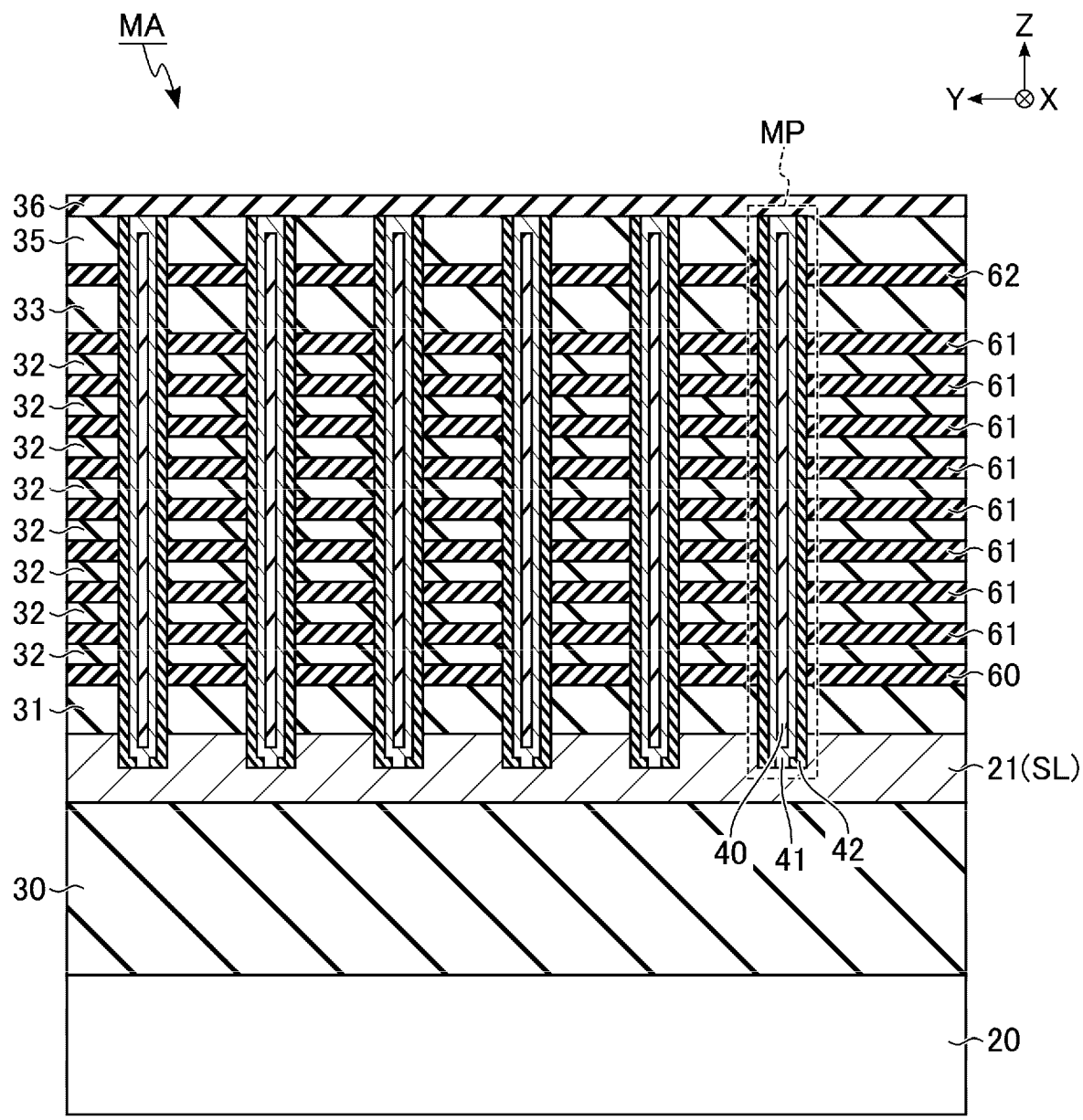
FIG. 11 is a cross-sectional view showing an example cross-sectional structure of the semiconductor device according to the embodiment in the course of its manufacture.

In step S12, memory pillars MP are formed as shown in FIG. 11. In particular, a cover insulating film 45, an insulating film 44 and a tunnel insulating film 43 are formed sequentially on the side surface and the bottom surface of each memory hole MH. Parts of the cover insulating film 45, the insulating film 44 and the tunnel insulating film 43, formed in the bottom of each memory hole MH, are removed, and a semiconductor layer 41 and a core member 40 are formed in the memory hole MH. Thereafter, part of the core member 40, formed at the top of the memory hole MH, is removed and a semiconductor layer 41 is formed in the space formed by the removal of part of the core member 40, thereby completing the formation of memory pillars MP. Thereafter, an insulator layer 36 is formed on the insulator layer 35 and the memory pillars MP. The insulator layer 36 protects the tops of the memory pillars MP. The insulator layers 35 and 36 are provided in the insulator layer 34 shown in FIG. 5.

Figure 12:
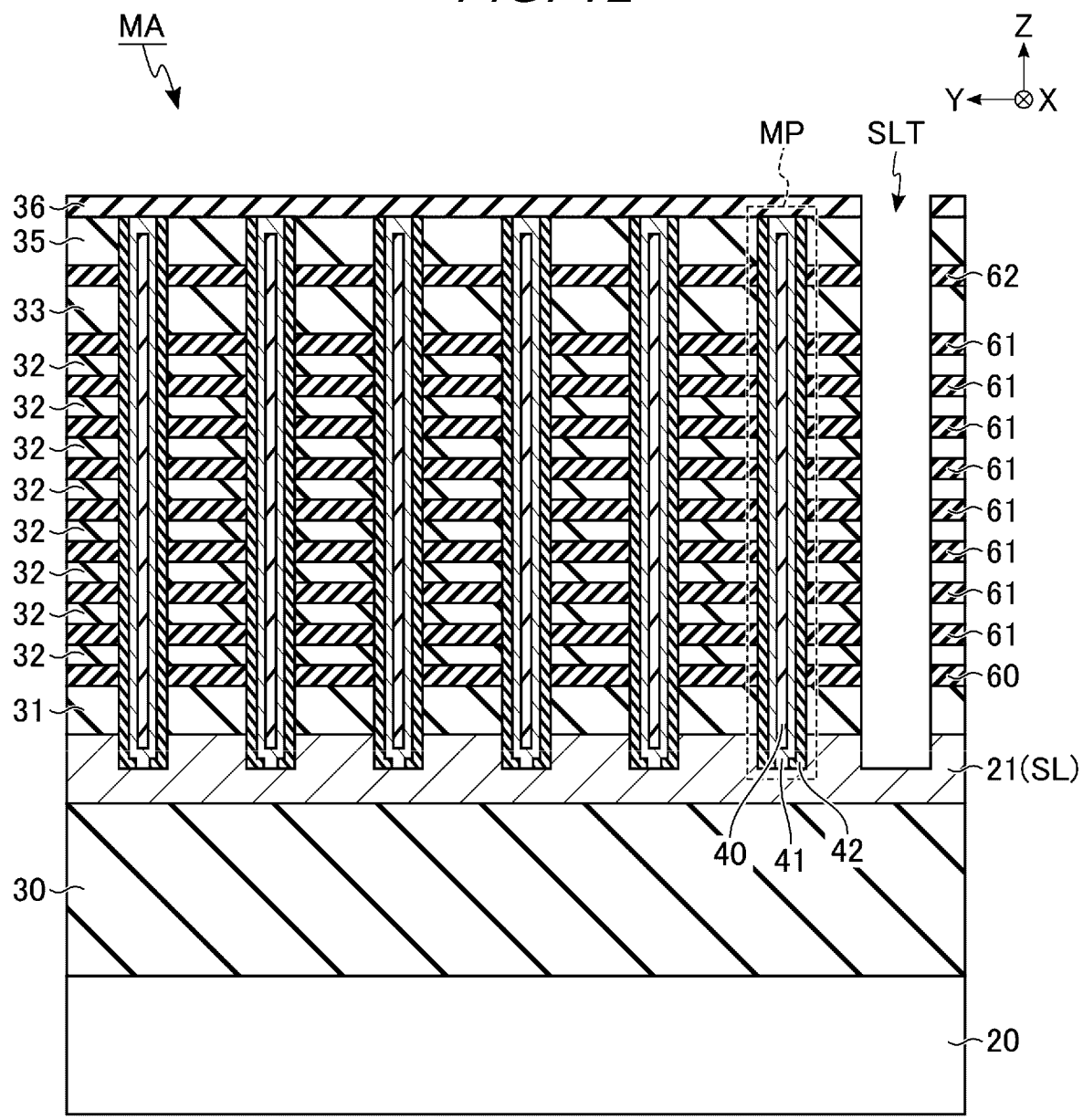
FIG. 12 is a cross-sectional view showing an example cross-sectional structure of the semiconductor device according to the embodiment in the course of its manufacture.

In step S13, slits SLT are formed as shown in FIG. 12. In particular, a mask having openings in areas corresponding to the slits SLT is formed. Anisotropic etching using the mask is then performed to form the slits SLT that separate each of the insulator layers 31, 32, 33, 35 and 36, and each of the sacrificial members 60, 61 and 62. The bottom of each slit SLT reaches, for example, the conductor layer 21. After the formation of the slits SLT, processing may be performed to form a protective film on the conductor layer 21 exposed at the bottom of each slit SLT.

Figure 13:
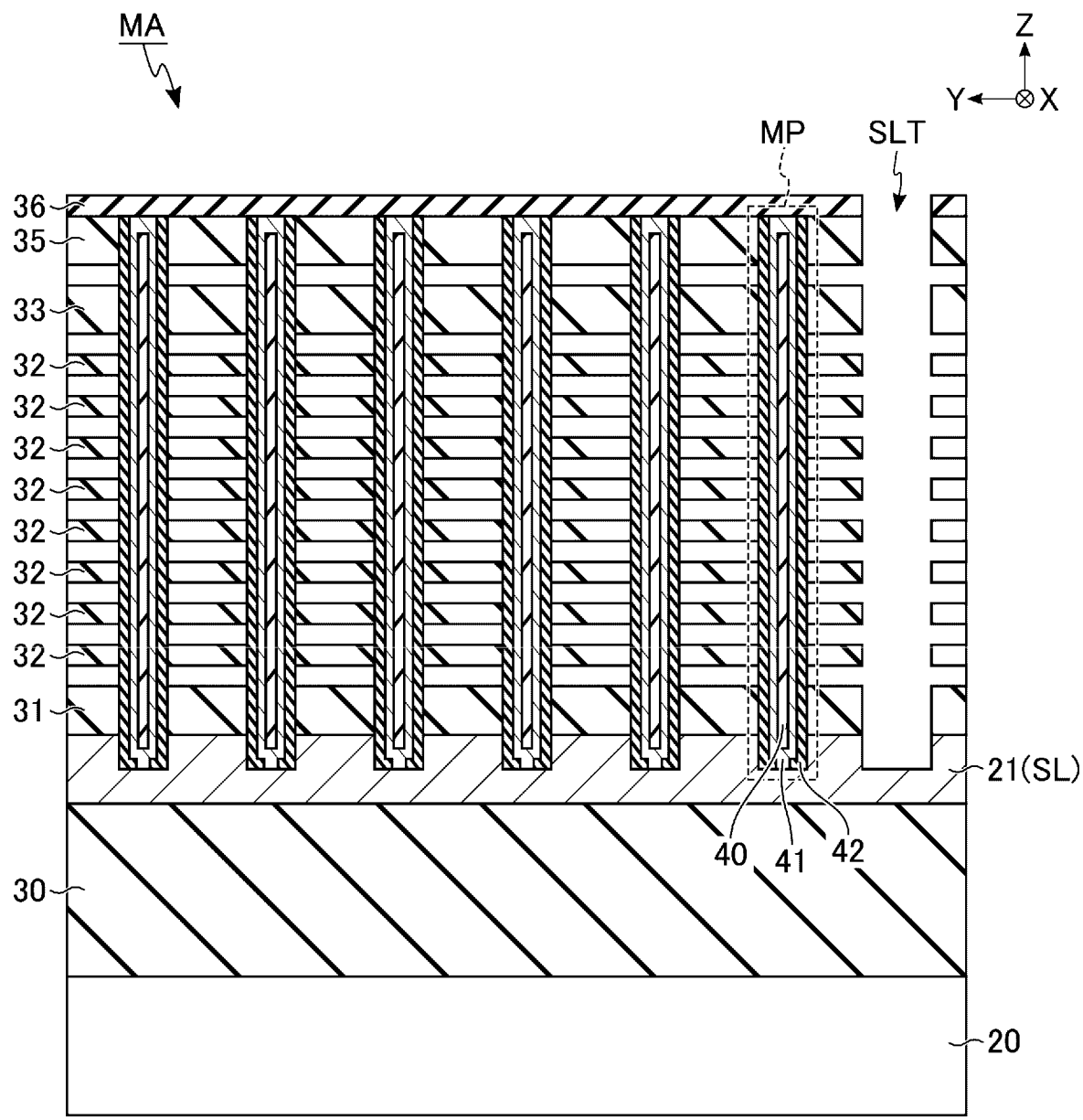
FIG. 13 is a cross-sectional view showing an example cross-sectional structure of the semiconductor device according to the embodiment in the course of its manufacture.

In step S14, the sacrificial members 60, 61 and 62 are removed as shown in FIG. 13. In particular, wet etching using hot phosphoric acid or the like is performed. More specifically, hot phosphoric acid or the like is supplied through the slit SLT to selectively remove the sacrificial members 60, 61 and 62. Further, though not shown diagrammatically, the cover insulating film 45, provided in each memory pillar MP in a portion in contact with one of the sacrificial members 60, 61 and 62, is removed. The structure after the removal of the sacrificial members 60, 61 and 62 is supported by the memory pillars MP, etc.

Figure 14:
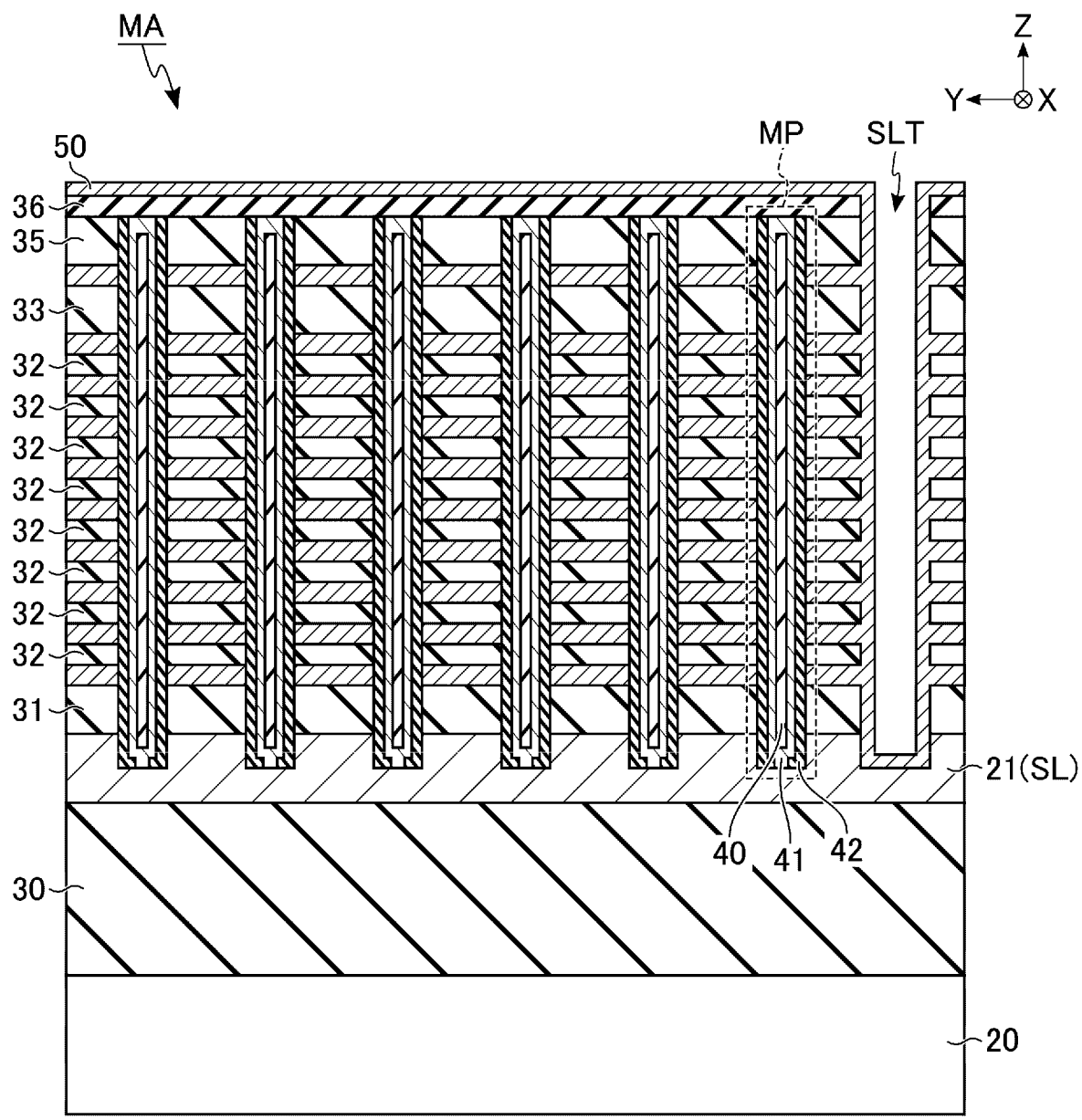
FIG. 14 is a cross-sectional view showing an example cross-sectional structure of the semiconductor device according to the embodiment in the course of its manufacture.

In step S15, a conductor 50 is formed as shown in FIG. 14. In particular, though not shown diagrammatically, a block insulating film 46 and a barrier metal 51 are first formed sequentially. Thermal CVD (Chemical Vapor Deposition) or ALD (Atomic Layer Deposition), for example, may be used for the formation of the block insulating film 46. A conductor 50 (molybdenum) is then embedded into the space formed by the removal of the sacrificial members 60 to 62. Thermal CVD (Chemical Vapor Deposition) or ALD (Atomic Layer Deposition), for example, may be used for the formation of the conductor 50 (molybdenum). The block insulating film 46, the barrier metal 51 and the conductor 50 are each formed also on the side surface of the slit SLT and the upper surface of the insulator layer 36. At this point, the conductor 50, embedded in the space formed by the removal of the sacrificial members 60 to 62, is formed continuously and electrically conductively.

Figure 15:
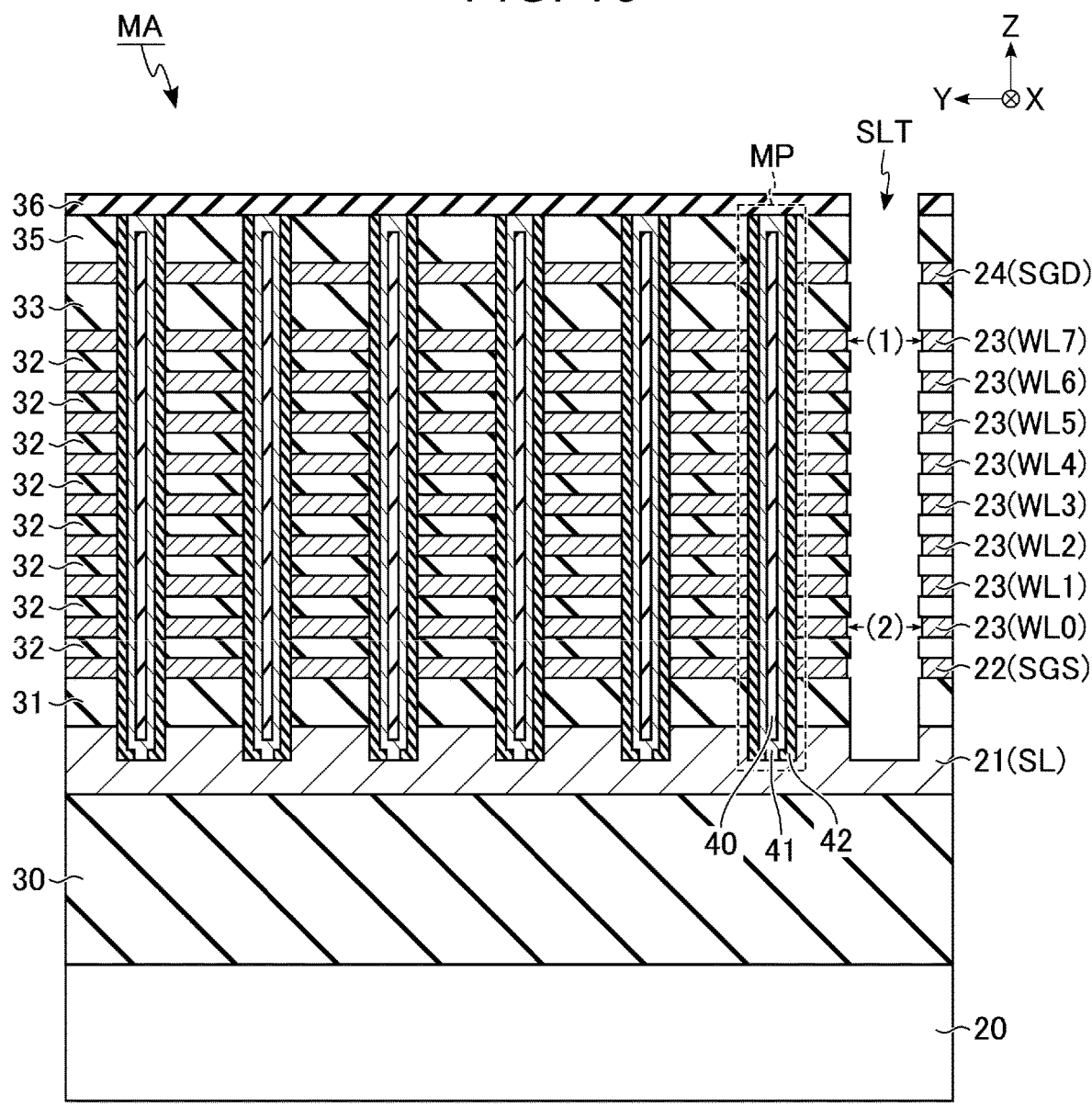
FIG. 15 is a cross-sectional view showing an example cross-sectional structure of the semiconductor device according to the embodiment in the course of its manufacture.

In step S16, etching of the conductor 50 (molybdenum) is performed as shown in FIG. 15. In particular, wet etching is performed using the chemical solution according to the embodiment. The conductor 50 formed on the side surface of the slit SLT and the conductor 50 formed on the upper surface of the insulator layer 36 are removed by the etching in step 16. The chemical solution, which comes into contact with the conductor 50 via the slit SLT, etches the molybdenum at approximately the same etching rate regardless of the height position in the slit SLT. It suffices if the conductor 50 formed between adjacent interconnect layers is at least separated by the etching. A conductor layer 22 which functions as a select gate line SGS, conductor layers 23 which respectively function as word lines WL0 to WL7, and a conductor layer 24 which functions as a select gate line SGD, are formed by the etching. The processing (etching) in step S16 is hereinafter referred to as "recessing of stacked interconnects". The amount of removal of the conductor 50 at an upper position in the slit SLT (e.g. (1) shown in FIG. 15) is hereinafter referred to as "top-side recessing amount", and the amount of removal of the conductor 50 at a lower position in the slit SLT (e.g. (2) shown in FIG. 15) is hereinafter referred to as "bottom-side recessing amount".

Figure 16:
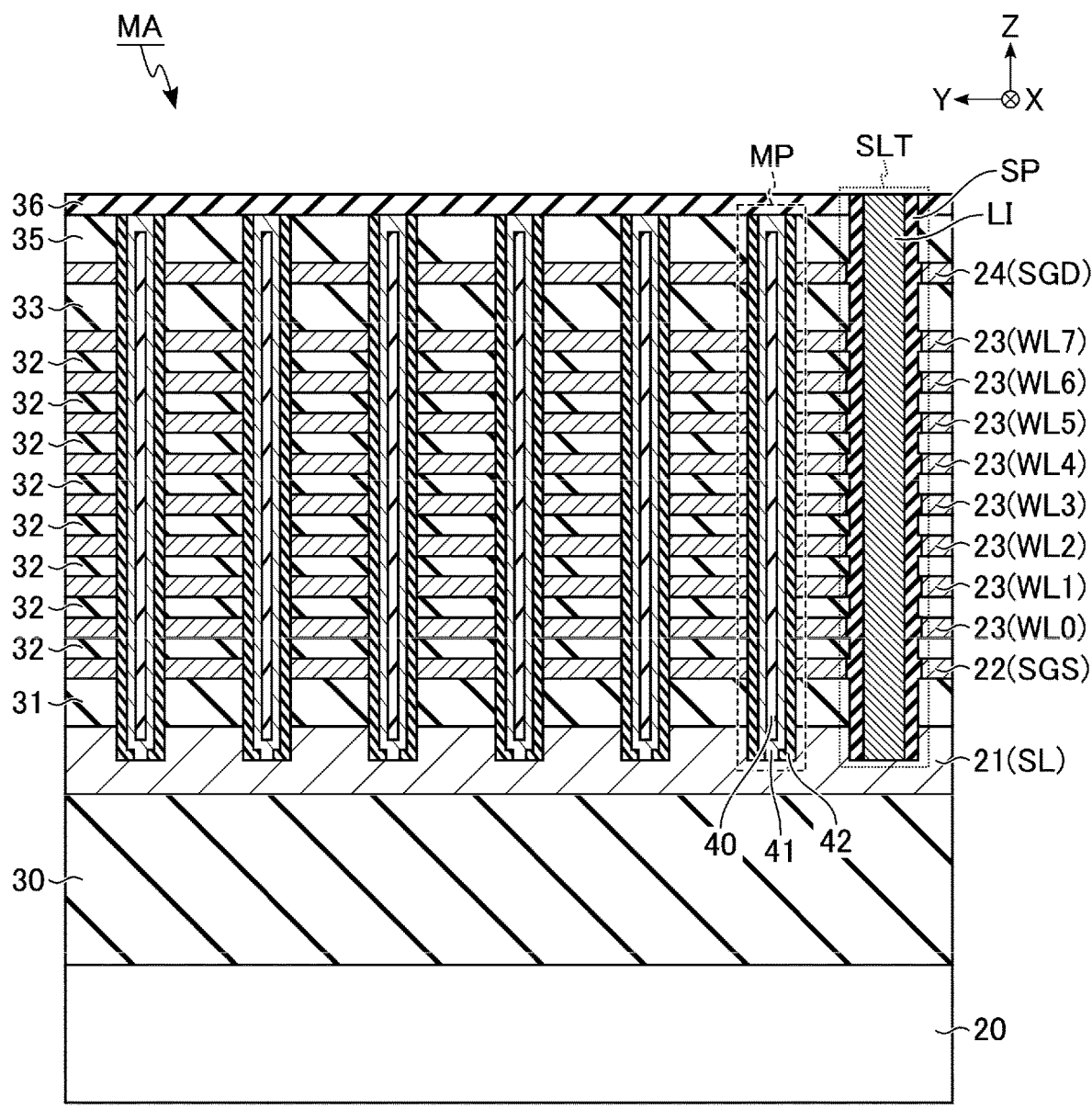
FIG. 16 is a cross-sectional view showing an example cross-sectional structure of the semiconductor device according to the embodiment in the course of its manufacture.

In step S17, filing of the slit SLT is performed as shown in FIG. 16. In particular, an insulating film (spacers SP) is formed such that it covers the side surfaces and the bottom surface of the slit SLT. Part of the spacers, formed at the bottom of the slit SLT, is removed to expose part of the conductor layer 21 at the bottom of the slit SLT. Thereafter, a conductor (contact LI) is formed in the slit SLT, and a conductor, formed outside the slit SLT, is removed e.g. by CMP (Chemical Mechanical Polishing). Thereafter, a plurality of grooves parallel to the slit SLT are formed between slits SLT, located adjacent to each other in the Y direction, and an insulating film is embedded into each groove to form slits SHE which separates the conductor layer 24 in the Y direction.

The stacked interconnect structure of the memory cell array 10 is thus formed by the semiconductor device 1 manufacturing process described above. The sequence of processings of steps S13 to S17 may be called "replacement process". The above-described manufacturing process is a mere example and not intended to limit the scope of the present disclosure. Thus, an additional process step may be inserted between some process steps, or some process step(s) may be omitted or integrated. For example, a process step of forming a stepped structure of stacked interconnects may be inserted between steps S10 and S11.

4 Effect of Embodiment

Owing to the use of the chemical solution containing polyethyleneimine in the recessing process for stacked interconnects, the semiconductor device manufacturing method according to the embodiment can reduce a top-bottom difference in the recessing amount, thereby improving the yield of the semiconductor device 1. This effect will now be described in detail.

A semiconductor device having three-dimensionally stacked memory cells has, for example, a stacked interconnect structure in which conductor layers and insulator layers are stacked alternately. A replacement process using sacrificial members, for example, is used for the formation of the stacked interconnects. The replacement process is performed by stacking the sacrificial members and the insulator layers alternately, and then replacing the sacrificial members with a conductor. Put simply, slits SLT that separate the stacked structure of the sacrificial members and the insulator layers are formed, and the sacrificial members are removed selectively through the slits SLT. A conductor is embedded into the spaces formed by the removal of the sacrificial members through the slits SLT. Thereafter, the conductor provided on the side surface of each SLT is removed by etching (recessing) to provide separate, stacked interconnects.

Tungsten (W) is known as a conductor for use in stacked interconnects. However, the use of tungsten in stacked interconnects may cause a device problem due to the generation of fluorine gas upon the formation of tungsten, the occurrence of warpage of a wafer caused by the formation of tungsten, etc. In view of this, the use of molybdenum as a conductor for use in stacked interconnects is being studied. Unlike tungsten, no fluorine gas is generated upon the formation of molybdenum. This can prevent the occurrence of a device problem due to degassing upon the formation of stacked interconnects. Furthermore, because of the lower interconnect resistance of molybdenum than tungsten, the use of molybdenum in stacked interconnects can also contribute to improvement in the performance of a semiconductor device.

A mixed acid comprising phosphoric acid, nitric acid, acetic acid and water, for example, is known as an etching solution for molybdenum (hereinafter referred to as an Mo etching solution). However, when such a mixed acid is used in etching of molybdenum, the high etching rate for molybdenum sometimes produces a variation in the etching amount of molybdenum. For example, in the recessing process according to the embodiment, there may be a difference in the recessing amount between the top side of a slit SLT and the bottom side of the slit SLT. Such a top-bottom difference in the recessing amount tends to be large when the slit SLT has a high aspect ratio (e.g., not less than 30). A large top-bottom difference in the recessing amount may cause a device problem. A mixed acid, having the same components as an effective etching solution but with a different compositional ratio, may be an ineffective etching solution that does not etch molybdenum.

The chemical solution according to the embodiment comprises a mixed acid, comprising an inorganic acid, an oxidizing agent, a carboxylic acid and water, and polyethyleneimine (PEI) as an additive. The molecular weight of PEI is, for example, not less than 100 and not more than 1800, and the concentration of the additive (polyethyleneimine) in the chemical solution is adjusted to be in the range of 0.05 wt % to 10 wt %. Etching of molybdenum using the chemical solution according to the embodiment progresses while protecting the surface of molybdenum with PEI. Accordingly, compared to the use of a mixed acid containing no PEI, the use of the chemical solution according to the embodiment achieves a lower etching rate for molybdenum.

Therefore, the semiconductor device manufacturing method according to the embodiment can reduce the top-bottom difference in the recessing amount in the stacked interconnect recessing process. In other words, the chemical solution according to the embodiment can reduce the top-bottom difference in the recessing amount, and can separate molybdenum into the respective interconnect layers without excessively etching some portions. Therefore, the chemical solution according to the embodiment, when used in the semiconductor device 1 manufacturing process (e.g., in step S16), can improve the yield of the semiconductor device 1.

Variations

Variations may be made to the semiconductor device 1 according to the above-described embodiment.

The memory cell array 10 of the semiconductor device 1 according to the embodiment may have a different structure. For example, the memory pillar MP may have a structure in which two or more pillars are coupled together in the Z direction. The memory pillar MP may have a structure in which a pillar corresponding to a select gate line SGD and a pillar corresponding to word lines WL are coupled together. The memory pillar MP may be connected to a bit line BL by a plurality of contacts coupled together in the Z direction. A conductor layer may be inserted into a junction between the contacts. The semiconductor layer 41 in the memory pillar MP may be connected to a source line SL via the side surface of the memory pillar MP.

While the memory pillar MP illustrated in the above-described drawings has the same diameter in the Z direction, the present disclosure is not limited to such a configuration. For example, the memory pillar MP may have a tapered or inverse tapered shape, or a centrally expanded shape (bowing shape). Similarly, each of the slits SLT and SHE may have a tapered or inverse tapered shape, or a bowing shape. The cross-sectional shape of the memory pillar MP is not limited to a circular shape; it may be an elliptical shape, or any other desired shape.

In an embodiment, the interior of each of the slits SLT and SHE may be composed of a single insulator or a plurality of insulators. In that case, for example, a contact for the source line SL (conductor layer 21) is provided in the extraction area HA. The position of the slit SLT may be identified, for example, based on the position of the contact LI. When the slit SLT is composed of an insulator, the position of the slit SLT may be identified by a seam in the slit SLT, or by a material that remains in the slit SLT after the replacement process.

In the above-described embodiment, a circuit corresponding to the sense amplifier module 16, etc. is provided under the memory cell array 10; however, the present disclosure is not limited to such a structure. For example, the semiconductor device 1 may have a structure in which stacked interconnects including word lines WL is formed on the semiconductor substrate 20, or a structure in which a chip having the sense amplifier module 16, etc. and a chip having the memory cell array 10 are bonded together. When the semiconductor device 1 has a chip-bonded structure, a configuration corresponding to the semiconductor substrate 20 may be omitted.

As used herein, "connection" refers to electrical connection, and does not exclude the presence of an intervening element. "Electrically connected" permits the presence of an intervening insulator if the same operation is performed. "Columnar" indicates a structure provided in a hole formed in a semiconductor device 1 manufacturing process. "The same layer structure" means that at least the order of formation of layers is the same. An "area" may be regarded as a configuration in the semiconductor substrate 20. For example, when the semiconductor substrate 20 is defined as including a memory area MA and an extraction area HA, the memory area MA and the extraction area HA are respectively related to different areas above the semiconductor substrate 20. "Height" corresponds to, for example, the Z-direction distance between a measuring object and the semiconductor substrate 20. A component or element other than the semiconductor substrate 20 may be used as a reference point for "height". "Molybdenum" refers to metallic molybdenum and includes elemental molybdenum.

In the above-described embodiment, the chemical solution containing polyethyleneimine is used in the manufacturing of the three-dimensional semiconductor device. However, the chemical solution according to the embodiment may be used in the manufacturing of other types of semiconductor devices. For example, the chemical solution according to the embodiment may be used in etching of a layer comprising molybdenum in the manufacturing of a transistor such as a thin-film transistor (TFT).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

EXAMPLES

The following examples illustrate the present disclosure in greater detail and are not intended to limit the scope of the present disclosure. Selective etching of molybdenum is hereinafter referred to as "Mo etching".

Evaluation of Top-Bottom Difference in Mo Etching (Preparation of Chemical Solution)

The chemical solution according to the embodiment is prepared by sequentially mixing phosphoric acid, nitric acid, acetic acid, and an aqueous PEI solution in this order. The temperature of the chemical solution upon its preparation is, for example, room temperature (about 23 to 24° C.). Each of the phosphoric acid, the nitric acid, the acetic acid, and the aqueous PEI solution may not be heated. The time from the start of preparation of the chemical solution to the completion of its preparation is about 10 to 20 minutes. The aqueous PEI solution is prepared before the preparation of the chemical solution. The aqueous PEI solution is prepared by adding PEI to water at room temperature. 10 types of chemical solutions were used in Example. The PEI concentrations of the 10 types of chemical solutions are: 0.05 wt %, 0.15 wt %, 0.3 wt %, 0.5 wt %, 0.9 wt %, 1 wt %, 1.5 wt %, 2 wt %, 2.78 wt %, and 3 wt %.

Production of Samples

Chips cut from wafers of three test lots LN1, LN2 and LN3 were used in a shape evaluation for Mo etching in the Example. The wafers of the test lots LN1, LN2 and LN3 were designed differently. In particular, the number of stacked sacrificial members, the number of stacked insulator layers, etc. differ between the wafers of the test lots LN1, LN2 and LN3. However, in all the wafers of the test lots LN1, LN2 and LN3, slits SLT, formed for a structure having a stacked structure of sacrificial members and insulator layers, have a high aspect ratio (>30). Therefore, the top-side recessing amount and the bottom-side recessing amount can be examined and compared between a chip cut from the wafer of the test lot LN1, a chip cut from the wafer of the test lot LN2, and a chip cut from the wafer of the test lot LN3.

Evaluation Results

In the shape evaluation for Mo etching in the Example, a cross-sectional image of a memory cell array 10 containing slits SLT was first taken for each chip. An SEM (Scanning Electron Microscope) was used to take the cross-sectional image of memory cell array 10. The top-bottom difference in the recessing amount of molybdenum in each slit SLT was determined from the cross-sectional image of memory cell array 10. The results of the evaluation of the top-bottom difference in Mo etching will now be described with reference to FIGS. 17 and 18.

Figure 17A:
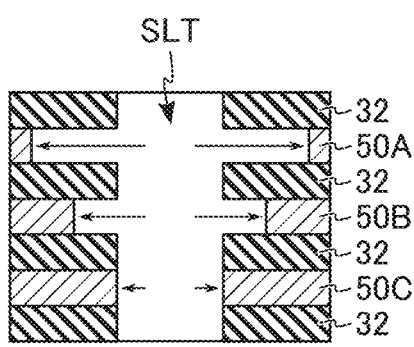
FIGS. 17A and 17B are schematic diagrams each showing an example cross-sectional structure of a memory cell array after Mo etching in Example.
Figure 17B:
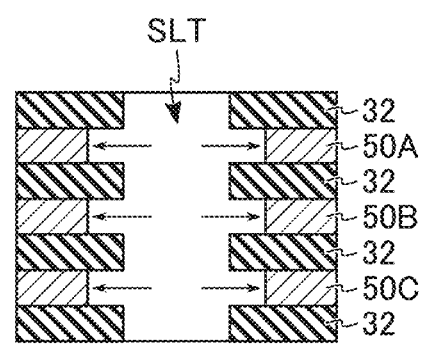

FIGS. 17A and 17B are schematic diagrams each showing an example cross-sectional structure of a memory cell array 10 after Mo etching in the Example. FIG. 17A shows an example cross-sectional structure of the memory cell array 10 in the case where the top-bottom difference is large. FIG. 17B shows an example cross-sectional structure of the memory cell array 10 in the case where the top-bottom difference is small. The three layers of the conductor 50, shown in FIGS. 17A and 17B, are herein referred to as 50A, 50B and 50C in order from the top.

In the example shown in FIG. 17A, the recessing amount in the etching process is larger in the conductor 50B than in the conductor 50C, and larger in the conductor 50A than in the conductor 50B. A large difference in the recessing amount between the top (e.g. the conductor 50A) and the bottom (e.g. the conductor 50C) as in this case corresponds to a large top-bottom difference. In the Example, a sample was rated as "no good", i.e. as having a significant top-bottom difference, in the shape evaluation for the sample when a shape similar to the shape shown in FIG. 17A was observed.

In the example shown in FIG. 17B, the recessing amount in the etching process is approximately the same in the conductors 50A, 50B and 50C. A small difference in the recessing amount between the top (e.g. the conductor 50A) and the bottom (e.g. the conductor 50C) as in this case corresponds to a small top-bottom difference. In the Example, a sample was rated as "good", i.e. as having no significant top-bottom difference, in the shape evaluation for the sample when a shape similar to the shape shown in FIG. 17B was observed.

FIG. 18 is a table showing the results of the shape evaluation for Mo etching in the Example, and shows the shape evaluation results in relation to the combination of the lot number, the additive (PEI) concentration, and the molecular weight of PEI. The evaluation results shown in FIG. 18 are based on the evaluation criteria described above with reference to FIG. 17. The "x/y" values shown in FIG. 18 correspond to the evaluation results. "x" indicates the number of slits SLT contained in a cross-sectional image of the sample and having a significant top-bottom difference. "y" indicates the total number of the slits SLT contained in the cross-sectional image of the sample.

The results of the cross-sectional evaluation were 5/5 for the combination of sample number SN1, the additive concentration 0.05 wt %, and PEI molecular weight 600. The results of the cross-sectional evaluation ware 5/5 for the combination of sample number SN1, the additive concentration 0.05 wt %, and PEI molecular weight 1800.

The results of the cross-sectional evaluation were 1/5 for the combination of sample number SN1, the additive concentration 0.15 wt %, and PEI molecular weight 600. The results of the cross-sectional evaluation were 5/5 for the combination of sample number SN1, the additive concentration 0.15 wt %, and PEI molecular weight 1800.

The results of the cross-sectional evaluation were 0/5 for the combination of sample number SN1, the additive concentration 0.3 wt %, and PEI molecular weight 600. The results of the cross-sectional evaluation were 1/5 for the combination of sample number SN1, the additive concentration 0.3 wt %, and PEI molecular weight 1800.

The results of the cross-sectional evaluation were 9/54 for the combination of sample number SN2, the additive concentration 0.3 wt %, and PEI molecular weight 600. The results of the cross-sectional evaluation were 4/18 for the combination of sample number SN2, the additive concentration 0.3 wt %, and PEI molecular weight 1800.

The results of the cross-sectional evaluation were 4/54 for the combination of sample number SN2, the additive concentration 0.5 wt %, and PEI molecular weight 600. The results of the cross-sectional evaluation were 4/54 for the combination of sample number SN2, the additive concentration 0.5 wt %, and PEI molecular weight 1800. The results of the cross-sectional evaluation were 54/54 for the combination of sample number SN2, the additive concentration 0.5 wt %, and PEI molecular weight 10000.

The results of the cross-sectional evaluation were 3/54 for the combination of sample number SN2, the additive concentration 0.9 wt %, and PEI molecular weight 1800.

The results of the cross-sectional evaluation were 0/54 for the combination of sample number SN2, the additive concentration 1 wt %, and PEI molecular weight 600.

The results of the cross-sectional evaluation were 3/54 for the combination of sample number SN2, the additive concentration 1.5 wt %, and PEI molecular weight 1800.

The results of the cross-sectional evaluation were 0/54 for the combination of sample number SN2, the additive concentration 2 wt %, and PEI molecular weight 600.

The results of the cross-sectional evaluation were 6/54 for the combination of sample number SN2, the additive concentration 2.78 wt %, and PEI molecular weight 10000.

The results of the cross-sectional evaluation were 0/54 for the combination of sample number SN2, the additive concentration 3 wt %, and PEI molecular weight 600. The results of the cross-sectional evaluation were 9/54 for the combination of sample number SN2, the additive concentration 3 wt %, and PEI molecular weight 1800.

Figure 19:
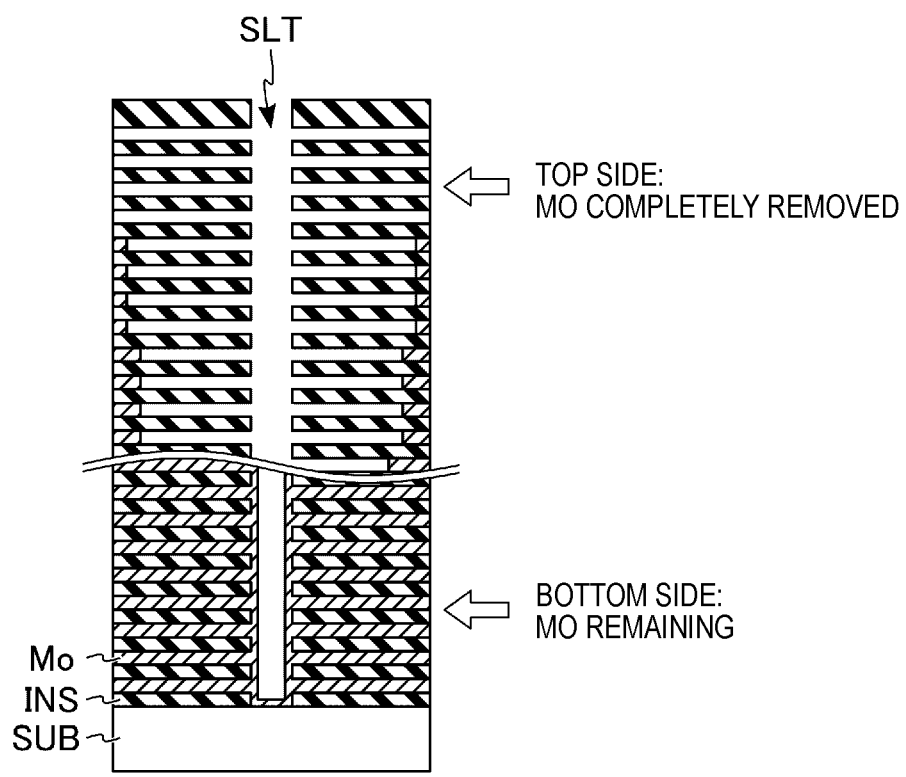
FIG. 19 is a schematic diagram showing a cross-sectional structure of a memory cell array after Mo etching in Comparative Example.

FIG. 19 is a schematic diagram showing a cross-sectional structure of a memory cell array after Mo etching in Comparative Example. In the Comparative Example, Mo etching using a metal-containing mixed acid was performed on a chip cut from a wafer of the test lot LN3 different from the test lots LN1 and LN2. In FIG. 19, "Mo" denotes a conductor comprising molybdenum. "INS" denotes an insulator layer. "SUB" denotes a semiconductor substrate. In the Comparative Example, insulator layers INS and sacrificial members were stacked alternately on the semiconductor substrate SUB. After the formation of slits SLT, a replacement process was performed. The Mo etching was performed in the replacement process.

As shown in FIG. 19, in the Comparative Example, molybdenum (Mo) was completely removed ("Mo completely removed") in a top-side area, while molybdenum (Mo) remained on the side surfaces of the slit ("Mo remaining") in a bottom-side area. Thus, in the Comparative Example, there is a large difference between the top-side recessing amount and the bottom-side recessing amount, i.e. a large top-bottom difference in Mo etching.

On the other hand, as described above with reference to FIGS. 17 and 18, the top-bottom difference in Mo etching is reduced or improved by using a chemical solution which contains polyethyleneimine and employs a combination of a predetermined additive (PEI) concentration and a predetermined molecular weight of PEI. In particular, at an additive concentration of 0.15 wt %, the top-bottom difference is better (smaller) when the molecular weight of PEI is 600 than when the molecular weight of PEI is 1800. At an additive concentration of 0.3 wt %, the top-bottom difference is better when the molecular weight of PEI is 600 than when the molecular weight of PEI is 1800. At an additive concentration of 0.5 wt %, the top-bottom difference is better when the molecular weight of PEI is 600 or 1800 than when the molecular weight of PEI is 10000. A slit SLT with a significant top-bottom difference was not detected when the molecular weight of PEI was 600 and the additive concentration was not less than 1 wt %. A slit SLT with a significant top-bottom difference was not detected when the additive concentration was 0.3, 1, 2 or 3 wt % and the molecular weight of PEI was 600.

Thus, the additive (polyethyleneimine) concentration of an Mo etching solution is preferably in the range of 0.05 wt % to 10 wt %. The molecular weight of PEI (the weight-average molecular weight of polyethyleneimine) contained in an Mo etching solution is preferably not less than 100 and not more than 1800. More preferably, the additive concentration is in the range of 1 wt % to 3 wt %, and the molecular weight of PEI is not less than 100 and not more than 600. In the molybdenum etching process, the top-bottom difference tends to be reduced or improved when PEI, used as an additive in an Mo etching solution, has a lower molecular weight and is used at a higher concentration.

What is claimed is:

1. A method, comprising:
    selectively etching a molybdenum layer using a chemical solution to remove a portion of the molybdenum layer, wherein the chemical solution includes (i) a mixed acid including an inorganic acid, an oxidizing agent, a carboxylic acid, and water, and (ii) a polyethyleneimine of a concentration in the chemical solution in a range of 0.05 wt % to 10 wt %,
    wherein the molybdenum layer comprises elemental molybdenum in an amount of not less than 99 atom %; and
    a concentration of the inorganic acid in the chemical solution is higher than a concentration of the polyethyleneimine and the concentration of the inorganic acid in the chemical solution is higher than a concentration of the water in the chemical solution.

2. The etching method according to claim 1, wherein a concentration of the inorganic acid in the chemical solution is in a range of 40 wt % to 80 Wt %, a concentration of the oxidizing agent in the chemical solution is not more than 5 wt %, a concentration of the carboxylic acid in the chemical solution is in a range of 0.1 wt % to 45 Wt %, and a concentration of the water in the chemical solution is not more than 30 wt %.

3. The etching method according to claim 1, wherein a weight-average molecular weight of the polyethyleneimine in the chemical solution is not less than 100 and not more than 1800.

4. The etching method according to claim 1, wherein the concentration of the polyethyleneimine in the chemical solution is in a range of 1 wt % to 3 wt %, and a weight-average molecular weight of the polyethyleneimine is not less than 100 and not more than 600.

5. The etching method according to claim 1, wherein the inorganic acid includes at least one of phosphoric acid or sulfuric acid.

6. The etching method according to claim 1, wherein the oxidizing agent includes at least one of nitric acid or hydrogen peroxide.

7. The etching method according to claim 1, wherein the carboxylic acid includes at least one of acetic acid, lactic acid, propionic acid, butyric acid, malonic acid, or citric acid.

8. A method for manufacturing a semiconductor device, comprising:
   forming a structure including sacrificial layers and insulator layers alternately stacked;
   forming a slit extending into the structure;
   replacing the sacrificial layers with conductors, respectively, wherein the conductors include a molybdenum layer; and
   selectively etching the molybdenum layer through the slit to remove a portion of the molybdenum layer using a chemical solution that includes: (i) a mixed acid including an inorganic acid, an oxidizing agent, a carboxylic acid, and water, and (ii) a polyethyleneimine with a concentration in the chemical solution in a range of 0.05 wt % to 10 wt %,
   wherein the molybdenum layer comprises elemental molybdenum in an amount of not less than 99 atom %; and
   a concentration of the inorganic acid in the chemical solution is higher than a concentration of the polyethyleneimine and the concentration of the inorganic acid in the chemical solution is higher than a concentration of the water in the chemical solution.

9. The method for manufacturing a semiconductor device according to claim 8, wherein a concentration of the inorganic acid in the chemical solution is in a range of 40 wt % to 80 wt %, a concentration of the oxidizing agent in the chemical solution is not more than 5 wt %, a concentration of the carboxylic acid in the chemical solution is in a range of 0.1 wt % to 45 wt %, and a concentration of the water in the chemical solution is not more than 30 wt %.

10. The method for manufacturing a semiconductor device according to claim 8, wherein a weight-average molecular weight of the polyethyleneimine in the chemical solution is not less than 100 and not more than 1800.

11. The method for manufacturing a semiconductor device according to claim 8, wherein the concentration of the polyethyleneimine in the chemical solution is in a range of 1 wt % to 3 wt %, and a weight-average molecular weight of the polyethyleneimine is not less than 100 and not more than 600.

12. The etching method according to claim 1, wherein the molybdenum layer is provided directly on an insulator layer.

13. The etching method according to claim 1, wherein the chemical solution consists of the mixed acid and the polyethyleneimine.

14. The etching method according to claim 8, wherein the conductors consist of the molybdenum layer.

15. The etching method according to claim 8, wherein the chemical solution consists of the mixed acid and the polyethyleneimine.

16. The etching method according to claim 8, wherein the slit having a high aspect ratio more than 30, and the etch process of the molybdenum layer through the slit comprises etching the molybdenum layer at approximately the same etching rate regardless of the height position in the slit.

17. The etching method according to claim 1, wherein the molybdenum layer is coupled to a barrier metal.

18. The etching method according to claim 8, wherein the molybdenum layer is coupled to a barrier metal.

* * * * *